(12) United States Patent
Nogami et al.

(10) Patent No.: US 6,777,321 B2
(45) Date of Patent: Aug. 17, 2004

(54) METHOD OF FORMING BURIED WIRING

(75) Inventors: Takeshi Nogami, Kanagawa (JP); Naoki Komai, Kanagawa (JP); Koichi Ikeda, Kanagawa (JP); Takashi Kinoshita, Hyogo (JP); Kohei Suzuki, Hyogo (JP); Nobuyuki Kawakami, Hyogo (JP); Yoshito Fukumoto, Hyogo (JP)

(73) Assignees: Sony Corporation (JP); Kabushiki Kaisha Kobe Seiko Sho (JP)

( * ) Notice: Subject to any disclaimer, the term of this patent is extended or adjusted under 35 U.S.C. 154(b) by 24 days.

(21) Appl. No.: 10/298,665

(22) Filed: Nov. 19, 2002

(65) Prior Publication Data

US 2003/0072888 A1 Apr. 17, 2003

Related U.S. Application Data

(62) Division of application No. 09/652,262, filed on Aug. 30, 2000, now Pat. No. 6,524,429.

(30) Foreign Application Priority Data

Aug. 31, 1999 (JP) .......................................... 11-244926
Aug. 2, 2000 (JP) ........................................ 2000-233954

(51) Int. Cl.[7] .............................................. H01L 21/44
(52) U.S. Cl. ...................... 438/622; 438/623; 438/725; 438/758
(58) Field of Search ............................... 438/623, 622, 438/782, 758, 780, 82, 725, 618, 666–675, 629, 637, 639, 640, 700–702; 257/642, 753, 774

(56) References Cited

U.S. PATENT DOCUMENTS 5,440,632 A 8/1995 Bacon et al.
5,666,293 A 9/1997 Metz et al.
5,734,589 A 3/1998 Kostreski et al.
5,965,202 A * 10/1999 Taylor-Smith et al. ...... 438/780
6,281,145 B1 * 8/2001 Deguchi et al. ............ 438/782

FOREIGN PATENT DOCUMENTS

JP 9-213797 8/1997
JP 09213797 * 8/1997 ......... H01L/21/768

OTHER PUBLICATIONS

Proceedings of the IEEE 2000 International Interconnect Technology Conference, Jun. 5–7, 2000, pp. 143–145.

Japanese *Journal of Applied Physics,* vol. 39 (2000) pp. L182–L184.

*Semiconductor International,* "Gas Do me System– Provides Unity-k Dielectric", Wade, Thomas E., Ph.D, pp. 125–132 (Jul. 1999).

* cited by examiner

*Primary Examiner*—Jack Chen
*Assistant Examiner*—Yennhu B. Huynh
(74) *Attorney, Agent, or Firm*—Rader, Fishman & Grauer PLLC

(57) ABSTRACT

A method of forming a buried wiring comprising the steps of: (A) forming a wiring and a first insulating layer filled between the wirings on a substratum, (B) immersing the first insulating layer in a fluid which can dissolve the first insulating layer, to dissolve the first insulating layer into the fluid, (C) substituting, for the fluid, a raw material solution containing a raw material for forming a second insulating layer, without bringing the wiring into contact with a gas, and (D) filling a second insulating layer formed by gelation in the raw material solution at least between the wirings, and then, drying off the raw material solution, thereby to form the second insulating layer at least between the wirings.

10 Claims, 20 Drawing Sheets

[STEP-100]

[STEP-100] CONTINUED

[STEP-110]

[STEP-120]

[STEP-120] CONTINUED

[STEP-130]

[STEP-140]

[STEP-140] CONTINUED

[STEP-150]

[STEP-150] CONTINUED

[STEP-150] CONTINUED

Fig. 13

SECOND PROCESSING APPARATUS

SUPPLYING AND MAINTAINING OF DISSOLVING FLUID

SECOND PROCESSING APPARATUS

SUBSTITUTION WITH PURE WATER AND MAINTAINING

SECOND PROCESSING APPARATUS

SUBSTITUTION WITH ALCOHOL AND MAINTAINING

SECOND PROCESSING APPARATUS

SUPPLYING OF RAW MATERIAL SOLUTION AND MAINTAINING

SUBSTRATA HOLDING TOOL

SUBSTRATA HOLDING

THIRD PROCESSING APPARATUS

SUBSTITUTION WITH SUPERCRITICAL FLUID AND DRYING

BATCH TYPE

Fig. 14

SECOND PROCESSING APPARATUS
| SUPPLYING AND MAINTAINING OF DISSOLVING FLUID |
|---|

SECOND PROCESSING APPARATUS
| SUBSTITUTION WITH PURE WATER AND MAINTAINING |
|---|

SECOND PROCESSING APPARATUS
| SUBSTITUTION WITH ALCOHOL AND MAINTAINING |
|---|

SECOND PROCESSING APPARATUS
| SUPPLYING OF RAW MATERIAL SOLUTION AND MAINTAINING |
|---|

SUBSTRATA HOLDING TOOL
| SUBSTRATA HOLDING |
|---|

DRYING APPARATUS
| DRYING OF RAW MATERIAL SOLUTION |   BATCH TYPE
|---|

Fig. 15

SECOND PROCESSING APPARATUS

| SUPPLYING AND MAINTAINING OF DISSOLVING FLUID |

SECOND PROCESSING APPARATUS

| SUBSTITUTION WITH PURE WATER AND MAINTAINING |

SECOND PROCESSING APPARATUS

| SUBSTITUTION WITH ALCOHOL AND MAINTAINING |

SECOND PROCESSING APPARATUS

| SUPPLYING OF RAW MATERIAL SOLUTION AND MAINTAINING |

THIRD PROCESSING APPARATUS

| SUBSTITUTION WITH SUPERCRITICAL FLUID AND DRYING |

SINGLE WAFER PROCESSING APPARATUS TYPE

SUBSTRATA HOLDING TOOL

| SUBSTRATA HOLDING |

Fig. 16

SECOND PROCESSING APPARATUS

| SUPPLYING AND MAINTAINING OF DISSOLVING FLUID |
|---|

SECOND PROCESSING APPARATUS

| SUBSTITUTION WITH PURE WATER AND MAINTAINING |
|---|

SECOND PROCESSING APPARATUS

| SUBSTITUTION WITH ALCOHOL AND MAINTAINING |
|---|

SECOND PROCESSING APPARATUS

| SUPPLYING OF RAW MATERIAL SOLUTION AND MAINTAINING |
|---|

DRYING APPARATUS

| DRYING OF RAW MATERIAL SOLUTION |
|---|

SINGLE WAFER PROCESSING APPARATUS TYPE

SUBSTRATA HOLDING TOOL

| SUBSTRATA HOLDING |
|---|

Fig. 19

THIRD PROCESSING APPARATUS

| SUPPLYING AND MAINTAINING OF DISSOLVING FLUID |

BATCH TYPE OR SINGLE WAFER PROCESSING APPARATUS TYPE

SECOND PROCESSING APPARATUS

| SUBSTITUTION WITH PURE WATER AND MAINTAINING |

SECOND PROCESSING APPARATUS

| SUBSTITUTION WITH ALCOHOL AND MAINTAINING |

SECOND PROCESSING APPARATUS

| SUPPLYING OF RAW MATERIAL SOLUTION AND MAINTAINING |

SUBSTRATA HOLDING TOOL

| SUBSTRATA HOLDING |

THIRD PROCESSING APPARATUS

| SUBSTITUTION WITH SUPERCRITICAL FLUID AND DRYING |

BATCH TYPE

Fig. 20

THIRD PROCESSING APPARATUS

| SUPPLYING AND MAINTAINING OF DISSOLVING FLUID |

BATCH TYPE OR SINGLE WAFER PROCESSING APPARATUS TYPE

SECOND PROCESSING APPARATUS

| SUBSTITUTION WITH PURE WATER AND MAINTAINING |

SECOND PROCESSING APPARATUS

| SUBSTITUTION WITH ALCOHOL AND MAINTAINING |

SECOND PROCESSING APPARATUS

| SUPPLYING OF RAW MATERIAL SOLUTION AND MAINTAINING |

SUBSTRATA HOLDING TOOL

| SUBSTRATA HOLDING |

DRYING APPARATUS

| DRYING OF RAW MATERIAL SOLUTION |

BATCH TYPE

METHOD OF FORMING BURIED WIRING

This is a divisional application of Ser. No. 09/652,262, filed on Aug. 30, 2000 now U.S. Pat. No. 6,524,429.

BACKGROUND OF THE INVENTION AND RELATED ART STATEMENT

The present invention relates to a method of forming a buried wiring and an apparatus for processing a substratum.

Studies are being vigorously made for decreasing a dielectric constant of an insulating interlayer used in a semiconductor device.

As one of the methods for decreasing the dielectric constant, studies are being made on the application of a porous insulating layer to an insulating interlayer. Having a low relative dielectric constant ($\in$), a porous insulating layer is expected to be promising as a raw material for decreasing a capacitance between wiring lines. In principle, a porous insulating layer is conventionally formed by a process of forming a porous structure having solid linkages on the basis of a solidification reaction according to dehydration/condensation in an aqueous solution containing tetraethoxysilane (TEOS) and ammonia ($NH_3$), and then drying off the aqueous solution.

And, a metal wiring is formed by a so-called damascene process in which a lithography method and a dry etching method are used to form a groove (trench) portion and/or a hole portion in the porous insulating layer formed according to the above process, a barrier metal and a metal material such as aluminum and copper are filled in the groove portion and/or the hole portion and deposited on the porous insulating layer, and further, the metal material and the barrier metal deposited on the porous insulating layer are removed by a chemical/mechanical polishing method (CMP method).

Further, a hollow wiring method is available as one of the methods of decreasing the capacitance between wiring lines. In the hollow wiring method, an insulating interlayer between wiring lines is removed to bring the space between the wiring lines into a hollow state, and air which substantially has a relative dielectric constant of 1 is used as an insulating substance. This method is disclosed, for example, in "Semiconductor International", July 1999, page 125. This hollow wiring method is already put to practical use for broad aluminum wiring lines in which a wiring line width is several microns or more.

For overcoming problems in the hollow wiring method, there is proposed a method in which a hollow portion between wiring lines is filled with a solid insulating layer. In this method, metal wiring lines are formed in an insulating layer composed of a phosphorus silicate glass (PSG), and then, the insulating layer is removed by a drying etching method in which the insulating layer is exposed to a gas containing hydrogen fluoride (HF) or plasma thereof. At this stage, the space between the wiring lines is brought into a hollow state, and the space between the wiring lines is filled with a gas. Then, a porous insulating layer having a low relative dielectric constant is grown from the surface of the metal wiring line by a chemical vapor deposition method (CVD method) to fill the porous insulating layer in the space between the wiring lines.

In the method using an insulating interlayer composed of a porous insulating layer, however, it is difficult to form a groove portion and/or a hole portion having a desired form in the porous insulating layer under good control by a dry etching method. There is another problem that the porous insulating layer is damaged when a photoresist used in a lithography method is removed, so that the porous insulating layer is altered in chemical properties and form. For avoiding this problem, it is required to keep the porous insulating layer not being exposed to an atmosphere employed for the photoresist removal. For this purpose, an addition step is required. There is still another problem that, when a metal material and a barrier metal deposited on the porous insulating layer is removed by a CMP method, the porous insulating layer having low mechanical strength is broken due to a shear force exerted on the porous insulating layer. For preventing this problem, it is required, on a CMP process, to set a polishing rate at a level at which the shear force on the porous insulating layer is lower than a shear force which breaks the porous insulating layer. However, this procedure involves a problem that the polishing rate of the metal material and the barrier metal deposited on the porous insulating layer is decreased, which results in a longer throughput.

Further, the hollow wiring method has the following problem when it is applied to an LSI wiring having a wiring line width of 1 $\mu$m or less. That is, a solution containing hydrofluoric acid is often used for removing a silicon-containing insulating interlayer, and a stress is caused between wiring lines due to a surface tension of water droplets formed between the wiring lines just before drying is finished in a drying step after a washing step. As a result, the wiring line may be mechanically deformed due to the above stress, which results in destruction. Further, if the drying is made possible by taking measures against the surface tension, the following problem takes place. That is, as the circuit operates, voltages of the wiring lines undergo changing. In this case, a local condenser having a potential difference between the adjacent wiring lines repeats charging and discharging, and due to the accumulation of a charge and the discharging, a Coulomb force between the adjacent wiring lines changes. As a result, the wiring lines vibrate, and when the vibration takes place intensely, the wiring lines may break due to the mechanical wearing of the wiring lines or a short circuit may be generated between the adjacent wiring lines. These problems make it difficult to apply the hollow wiring method to fine wiring lines in which a distance between the wiring lines is small.

In the method in which a hollow portion between wiring lines is filled with a solid insulating layer, a source gas used in the CVD method is fed from the top surface of each wiring line to side surfaces of each wiring line, so that an insulating layer is formed on the top surface earlier than it is formed on the side surfaces. Therefore, the insulating layer is formed on the top portions of the adjacent wiring lines before the insulating layer is formed in the bottom portions of the wiring lines and before a space between the lower portions of the adjacent wiring lines is filled with the insulating layer, so that a space between the upper portions of the adjacent wiring lines is filled with the insulating layer. As a result, there is caused a problem that there is a region which is not filled with the insulating layer between the wiring lines. Due to this problem, it is difficult to realize the technology of filling a hollow portion by removing the insulating layer in a gaseous phase and forming a new insulating layer in a gaseous phase. Further, there is another problem that a device isolation region and a gate insulating layer of a transistor portion are damaged with an etching gas used for removing the insulating layer by a dry etching method.

OBJECT AND SUMMARY OF THE INVENTION

It is therefore an object of the present invention to provide a method of forming a buried wiring, in which high reliability is accomplished, the wiring is neither damaged nor broken, an insulating layer used for burying the wiring is not damaged, and an insulating material can be reliably filled between the wirings.

It is another object of the present invention to provide an apparatus for processing a substratum which apparatus is suitable for practicing the above method of forming a buried wiring.

According to the present invention, the above object of the present invention is achieved by a method of forming a buried wiring, which method comprises the steps of:

(A) forming a wiring and a first insulating layer filled between the wirings on a substratum, (B) immersing the first insulating layer in a fluid which can dissolve the first insulating layer, to dissolve the first insulating layer into the fluid, (C) substituting, for the fluid, a raw material solution containing a raw material for forming a second insulating layer, without bringing the wiring into contact with a gas, and (D) filling a second insulating layer formed by gelation in the raw material solution at least between the wirings, and then, drying off the raw material solution, thereby to form the second insulating layer at least between the wirings.

The wording "to form the second insulating layer at least between the wirings" includes the formation of the second insulating layer on the wiring. The wording "drying off the raw material solution" means the removal of a liquid component (for example, solvent) contained in the raw material solution.

In the method of forming a buried wiring in the present invention (to be sometimes referred to as "forming method of the present invention" hereinafter), there may be employed a constitution in which the first insulating layer is composed of a silicon oxide material and the fluid (first-insulating-layer dissolving fluid) is an aqueous solution containing fluorine.

The silicon oxide material constituting the first insulating layer includes $SiO_2$, BPSG, PSG, BSG, AsSG, PbSG, SbSG, NSG, SOG and SiON. The aqueous solution containing fluorine includes a 0.5 wt % hydrofluoric acid aqueous solution and a hydrofluoric acid buffer solution (mixture of HF and $NH_4F$).

In the forming method of the present invention, there may be employed a constitution in which the first insulating layer is composed of an organic insulating material and the fluid (first-insulating-layer dissolving fluid) is one member selected from the group consisting of an amine-containing alkaline solution, a nitric acid aqueous solution and a mixture solution of hydrofluoric acid and nitric acid (a hydrofluoric acid/nitric acid/water volume ratio, for example, of 1:1:4), or the fluid (first-insulating-layer dissolving fluid) is one supercritical fluid selected from the group consisting of water, carbon dioxide, methyl alcohol, ethyl alcohol and oxygen.

The term "supercritical fluid" refers to a fluid having a temperature and a pressure a little higher than a critical point in a temperature-pressure-entropy phase diagram.

The above organic insulating material constituting the first insulating layer includes fluorine-free polymers such as polyaryl ether, benzocyclobutene (BCB) and polyimide; fluorine-containing polymers such as fluorine-added polyimide, tetrafluoroethylene, cycloperfluorocarbon, fluorinated polyaryl ether and fluorine-added parylene; organic SOG, silicon oxide xerogel, and amorphous carbon.

In the forming method of the present invention, the step (C) preferably has the steps of:

(C-1) substituting pure water for the fluid, (C-2) substituting an alcohol solvent for the pure water, and (C-3) substituting the raw material solution for the alcohol solvent. Through the above steps, the fluid can be reliably replaced with the raw material solution containing a raw material for forming the second insulating layer.

The above alcohol solvent includes methyl alcohol, ethyl alcohol, n-propyl alcohol and isopropyl alcohol.

In the forming method of the present invention, the raw material solution may be a solution containing an organic polymer formed by hydrolyzing a silicon alkoxide and dehydration-condensing the resultant silicon hydroxide. The step of drying off the raw material solution in the above step (D) may include the steps of (D-1) substituting a supercritical fluid for the solvent in the raw material solution and (D-2) removing the supercritical fluid, or may be the step of removing the solvent in the raw material solution under a pressure equal to, or lower than, atmospheric pressure.

Specifically, the above organic polymer formed by hydrolyzing a silicon alkoxide and dehydration-condensing the resultant silicon hydroxide includes alkoxysilanes [$H_xSi(OR)_{4-x}$ in which x=1, 2 or 3 and R is an alkyl group] such as tetraethoxysilane (TEOS), tetramethoxysilane and triethoxysilane. Specifically, the supercritical fluid used for substituting it for the solvent in the raw material solution includes carbon dioxide ($CO_2$) and alcohols such as methyl alcohol and ethyl alcohol.

Otherwise, in the forming method of the present invention, the raw material solution may be a solution containing an organic polymer containing carbon and fluorine or a condensate thereof. The step of drying off the raw material solution in the above step (D) may include the steps of (D-1) substituting a supercritical fluid for the solvent in the raw material solution and (D-2) removing the supercritical fluid, or may be the step of removing the solvent in the raw material solution under a pressure equal to, or lower than, atmospheric pressure.

Specifically, the organic polymer containing carbon and fluorine or the condensate thereof includes cycloperfluorocarbon, fluorine-added polyimide, tetrafluoroethylene, fluorinated polyaryl ether and fluorine-added parylene. Specifically, the supercritical fluid used for substituting it for the solvent in the raw material solution includes carbon dioxide ($CO_2$) and alcohols such as methyl alcohol and ethyl alcohol.

Prior to the step (A), the forming method of the present invention preferably includes the step of forming a protective insulating layer on the substratum for protecting the substratum from the fluid (first-insulating-layer dissolving fluid) which dissolves the first insulating layer. If formed, the protective insulating layer serves to reliably prevent damage on the substratum when the first insulating layer is dissolved. The protective insulating layer includes SiN, SiON, SiC and SiOC.

In the forming method of the present invention, the substratum includes a semiconductor substrate; a lower insulating layer formed on or above a semiconductor substrate; a semiconductor substrate having a semiconductor device or a lower wiring layer; a lower insulating layer formed on or above a semiconductor substrate having a semiconductor device or a lower wiring layer; a combination of a lower wiring layer and a lower insulating layer formed on or above a semiconductor substrate; a combination of a connection hole (which generically refers to a contact hole, a via hole and a through hole) and a lower insulating layer formed on or above a semiconductor substrate; and a combination of a lower wiring layer, a connection hole and a lower insulating layer formed on or above a semiconductor substrate. The wiring includes a wiring line, a connection hole, an electrode, a combination of a wiring line and a connection hole, a combination of a wiring line and an electrode, a combination of a connection hole and an electrode, and a combination of a wiring line, a connection hole and an electrode. The material constituting the wiring includes metals such as copper, aluminum, gold and tungsten, compounds of these metals, and alloys of these metals.

In the forming method of the present invention, since the second insulating layer is formed at least between the wirings without dry etching the second insulating layer in the step (D), it is not required to form a resist mask on the second insulating layer. Unlike a conventional method, therefore, no damage is caused on the second insulating layer by the removal of the resist mask.

In the step (C), further, since the fluid is replaced with the raw material solution without bringing the wiring into contact with a gas, no water droplets are formed between the wirings. Therefore, the wiring is free from a phenomenon that a stress is caused between the wirings due to a surface tension of the water droplets and the wiring is mechanically deformed due to the stress and is broken.

In the step (D), at least a region between the wirings is filled with the second insulating layer in a gelled state in the raw material solution in a state where the wiring is covered with the raw material solution, and then, the raw material solution is dried off, so that the region between the wirings is uniformly. filled with the second insulating layer. Therefore, there is no case where a hollow portion having no second insulating layer formed remains between the wirings, and the region between the wirings is reliably filled with the second insulating layer, so that there is no case where the wiring, a wiring line in particular, vibrates due to a change in Coulomb force between the wirings.

Further, it is no longer necessary to employ the step of removing the second insulating layer by a CMP method, so that the second insulating layer suffers no shear stress caused by polishing, which obviates the destruction of the second insulating layer caused by the shear stress.

According to the present invention, the above object of the present invention is achieved by an apparatus for processing a substratum for removing a first insulating layer filled between wirings formed on a substratum, and then, forming a second insulating layer at least between the wirings, the apparatus for processing a substratum comprising:
(a) first-insulating-layer removing means for immersing the first insulating layer in a fluid which can dissolves the first insulating layer, to dissolve the first insulating layer into the fluid,
(b) raw-material-solution substituting means for substituting, for the fluid, a raw material solution containing a raw material for forming the second insulating layer, and
(c) drying means for drying off the raw material solution, thereby to form the second insulating layer at least between the wirings.

In the apparatus for processing a substratum of the present invention, the first-insulating-layer removing means and the raw-material-solution substituting means may be structured of one process chamber, that is, may share one process chamber, and the process chamber has:

(d) a substratum supporting stage which is disposed in the process chamber and is for supporting the substratum thereon, and
(e) a substratum transfer portion provided in the process chamber, and wherein:
the first-insulating-layer removing means further has:
(a-1) a fluid supply source for supplying the fluid for dissolving the first insulating layer,
(a-2) a piping connected to the fluid supply source, and
(a-3) a nozzle which is connected to the piping, is disposed in the process chamber and is for supplying the fluid for dissolving the first insulating layer to the substratum, and the raw-material-solution substituting means further has:
(b-1) a processing fluid supply source,
(b-2) a piping connected to the processing fluid supply source, and
(b-3) a nozzle which is connected to the piping, is disposed in the process chamber and is for supplying the processing fluid to the substratum.

A structure of a combination of the above-structured first-insulating-layer removing means and the above-structured raw-material-solution substituting means will be referred to as a "first-structured apparatus" for convenience hereinafter.

Otherwise, the apparatus for processing a substratum of the present invention may have a structure in which:

the first-insulating-layer removing means has:
(a-1) a process chamber,
(a-2) a substratum supporting stage which is disposed in the process chamber and is for supporting the substratum thereon,
(a-3) a substratum transfer portion provided in the process chamber,
(a-4) a fluid supply source for supplying the fluid for dissolving the first insulating layer,
(a-5) a piping connected to the fluid supply source, and
(a-6) a nozzle which is connected to the piping, is disposed in the process chamber and is for supplying the fluid for dissolving the first insulating layer to the substratum, and the raw-material-solution substituting means has:
(b-1) a process chamber,
(b-2) a substratum supporting stage which is disposed in the process chamber and is for supporting the substratum thereon,
(b-3) a substratum transfer portion provided in the process chamber,
(b-4) a processing fluid supply source,
(b-5) a piping connected to the process fluid supply source, and
(b-6) a nozzle which is connected to the piping, is disposed in the process chamber and is for supplying a processing fluid to the substratum. Each of the above-structured first-insulating-layer removing means and the above-structured raw-material-solution substituting means will be referred to as a "second-structured apparatus" for convenience hereinafter.

Otherwise, the apparatus for processing a substratum of the present invention may have a structure in which:

the first-insulating-layer removing means has:

(a-1) a process chamber which has an opening portion and is for receiving the substratum therein, (a-2) a lid for hermetically closing the opening portion, (a-3) a fluid supply source of the fluid for dissolving the first insulating layer, (a-4) a fluid supply means which is connected to the fluid supply source and is for introducing the fluid into the process chamber, (c-5) a fluid discharge means for discharging the fluid introduced into the process chamber, and (c-6) a heating means for heating the fluid introduced into the process chamber, and the raw-material-solution substituting means has:

(b-1) a process chamber, (b-2) a substratum supporting stage which is disposed in the process chamber and is for supporting the substratum thereon, (b-3) a substratum transfer portion provided in the process chamber, (b-4) a processing fluid supply source, (b-5) a piping connected to the process fluid supply source, and (b-6) a nozzle which is connected to the piping, is disposed in the process chamber and is for supplying a processing fluid to the substratum.

The above-structured first-insulating-layer removing means will be referred to as "third-structured apparatus" for convenience hereinafter. The third-structured apparatus is suitable for carrying out the processing with a supercritical fluid. The raw-material-solution substituting means is the above second-structured apparatus.

The fluid supply means (first-insulating-layer dissolving fluid supply means) in the first-insulating-layer removing means preferably has a pressure-temperature control means which is connected to the fluid supply source (first-insulating-layer dissolving fluid supply source) and is for controlling the pressure and temperature of the fluid (first-insulating-layer dissolving fluid) for dissolving the first insulating layer at predetermined levels, and a fluid supply port which is connected to the pressure-temperature control means and is disposed in the process chamber. The fluid discharge means in the first-insulating-layer removing means preferably has a fluid discharge port disposed in the process chamber and a discharged liquid separation apparatus connected to the fluid discharge port through a discharge pressure valve.

In the apparatus for processing a substratum of the present invention, the drying means can have a structure having:

(c-1) a process chamber which has an opening portion and is for receiving the substratum therein, (c-2) a lid for hermetically closing the opening portion, (c-3) a fluid supply source of a fluid for drying off the raw material solution, (c-4) a fluid supply means which is connected to the fluid supply source and is for introducing the fluid into the process chamber, (c-5) a fluid discharge means for discharging the fluid introduced into the process chamber, and (c-6) a heating means for heating the fluid introduced into the process chamber.

The above-structured drying means is an apparatus having the above third-structured apparatus.

The fluid supply means (drying fluid supply means) in the drying means preferably has a pressure-temperature control means which is connected to the fluid supply source (drying fluid supply source) and is for controlling the pressure and temperature of the fluid for drying off the raw material solution at predetermined levels, and a fluid supply port which is connected to the pressure-temperature control means and is disposed in the process chamber. The fluid discharge means in the drying means preferably has a fluid discharge port disposed in the process chamber and a discharged liquid separation apparatus connected to the fluid discharge port through a discharge pressure valve.

Otherwise, in the apparatus for processing a substratum, the drying means preferably comprises a drying apparatus.

The following Table 1 shows combinations of the first-structured apparatus, the second-structured apparatus, the third-structured apparatus and the drying apparatus which constitute the apparatus for processing a substratum of the present invention. In Table 1, "1st" stands for the first-structured apparatus, "2nd" stands for the second-structured apparatus, "3rd" stands for the third-structured apparatus, and "DA" stands for the drying apparatus.

TABLE 1

| | | | | | | |
|---|---|---|---|---|---|---|
| First-insulating-layer removing means | 1st | 1st | 2nd | 2nd | 3rd | 3rd |
| Raw-material-solution substituting means | 1st | 1st | 2nd | 2nd | 2nd | 2nd |
| Drying means | 3rd | DA | 3rd | DA | 3rd | DA |

BRIEF DESCRIPTION OF THE DRAWINGS

The present invention will be explained with reference to drawings hereinafter.

FIG. 1C, are schematic partial end view of the substratum, etc., for explaining the method of forming a buried wiring in Example 1.

FIG. 2B, are schematic partial end view of the substratum, etc., for explaining the method of forming a buried wiring in Example 1.

FIG. 3B, are schematic partial end view of the substratum, etc., for explaining the method of forming a buried wiring in Example 1.

FIG. 4B, are schematic partial end view of the substratum, etc., for explaining the method of forming a buried wiring in Example 1.

FIG. 13 is further another block diagram of a constitution example of an apparatus for processing a substratum for carrying out the method of forming a buried wiring in the present invention.

FIG. 14 is further another block diagram of a constitution example of an apparatus for processing a substratum for carrying out the method of forming a buried wiring in the present invention.

FIG. 15 is further another block diagram of a constitution example of an apparatus for processing a substratum for carrying out the method of forming a buried wiring in the present invention.

FIG. 16 is further another block diagram of a constitution example of an apparatus for processing a substratum for carrying out the method of forming a buried wiring in the present invention.

FIG. 19 is further another block diagram of a constitution example of an apparatus for processing a substratum for carrying out the method of forming a buried wiring in the present invention.

FIG. 20 is further another block diagram of a constitution example of an apparatus for processing a substratum for carrying out the method of forming a buried wiring in the present invention.

DESCRIPTION OF THE PREFERRED EMBODIMENTS

EXAMPLE 1

Figure 1A:
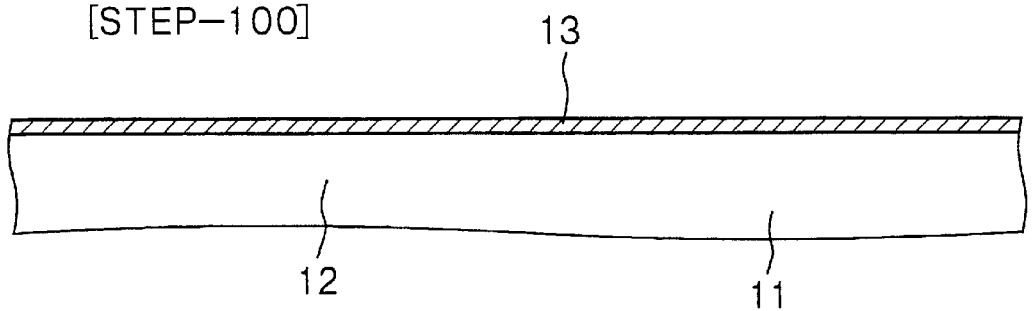
FIGS. 1A, 1B and 1C are schematic partial end view of a substratum, etc., for explaining the method of forming a buried wiring in Example 1.
Figure 1B:
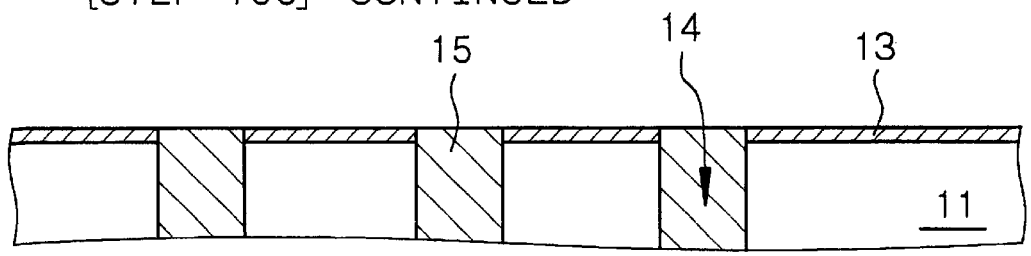

Example 1 is concerned with a method of forming a buried wiring, provided by the present invention. The method of forming a buried wiring in Example 1 will be explained with reference to FIGS. 1A, 1B, 1C, 2A, 2B, 3A, 3B, 4A, 4B, 5A and 5B showing schematic partial cross-sectional views of a substratum and the like.

[Step-100]

First, a semiconductor device such as a transistor and a lower wiring layer (these are not shown) are formed in or on a semiconductor substrate (not shown), and then, a lower insulating layer 12 is formed thereon. The lower insulating layer 12 corresponds to a substratum 11. Then, a protective insulating layer 13 for protecting the lower insulating layer 12 from a fluid (first-insulating-layer dissolving fluid) to be used for dissolving a first insulating layer in a step to come later is formed on the lower insulating layer 12, for example, by a CVD method (see FIG. 1A). The protective insulating layer 13 is composed of silicon nitride (SiN). Then, a hole portion 14 is formed in predetermined portions of the protective insulating layer 13 and the lower insulating layer 12, and a plug 15 is formed inside the hole portion 14 (see FIG. 1B). The plug 15 is composed, for example, of tungsten, and its lower end is contacted with the semiconductor device such as a transistor or the lower wiring layer (these are not shown). In this manner, there can be obtained the substratum 11 on which the protective insulating layer 13 for separating a device-forming region such as a transistor-forming region and a wiring region is formed. The plug 15 can be formed by a known plug-forming method such as a Blanket CVD tungsten plug method.

[Step-110]

Figure 1C:
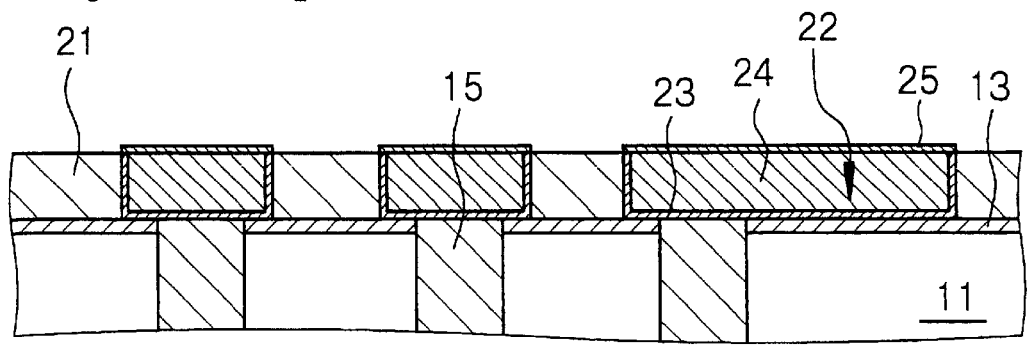

Then, a first insulating interlayer 21 composed of silicon oxide ($SiO_2$) is formed on the protective insulating layer 13 by a CVD method. Thereafter, for example, a conventional single damascene process is carried out. Specifically, a groove (trench) portion 22 for forming a first wiring is formed in the first insulating interlayer 21 so as, for example, to be contacted with the plug 15. Then, a first barrier metal layer 23 composed, for example, of tantalum nitride is formed on the entire surface including the inside surface of the groove portion 22. Then, a copper (Cu) layer is formed on the first insulating interlayer 21 including the inside of the groove portion 22, and the copper layer and the barrier metal layer 23 on the first insulating interlayer 21 are removed, for example, by a CMP method. In this manner, a first wiring 24 composed of copper can be formed in the groove portion 22. Then, a second barrier metal layer 25 composed of cobalt-tungsten-phosphorus (CoWP) is formed on the first wiring 24, for example, by a selective growth method (FIG. 1C). The first wiring 24 is in a state where it is covered with the first barrier metal layer 23 and the second barrier metal layer 25.

[Step-120]

Figure 2A:
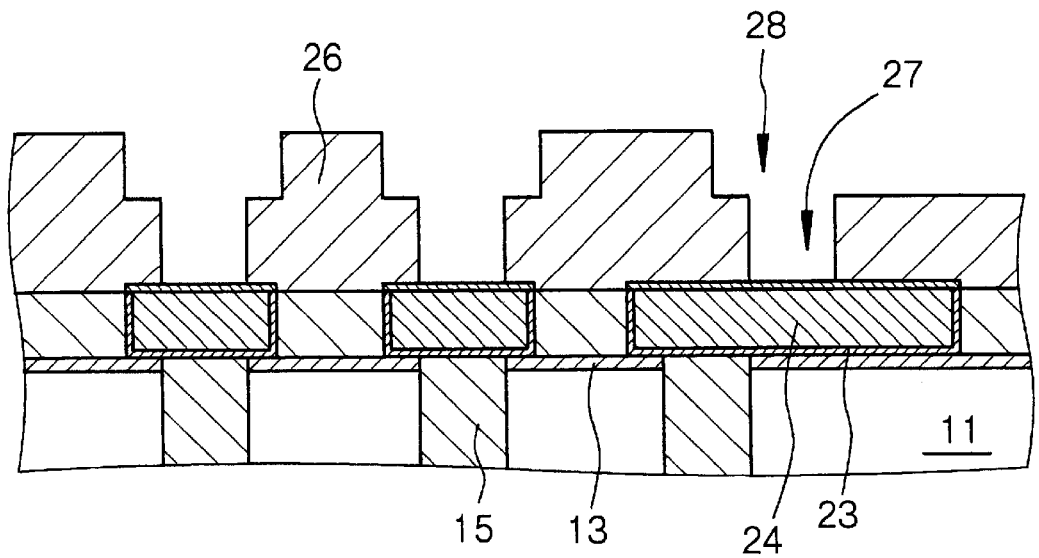
FIGS. 2A and 2B, following
Figure 2B:
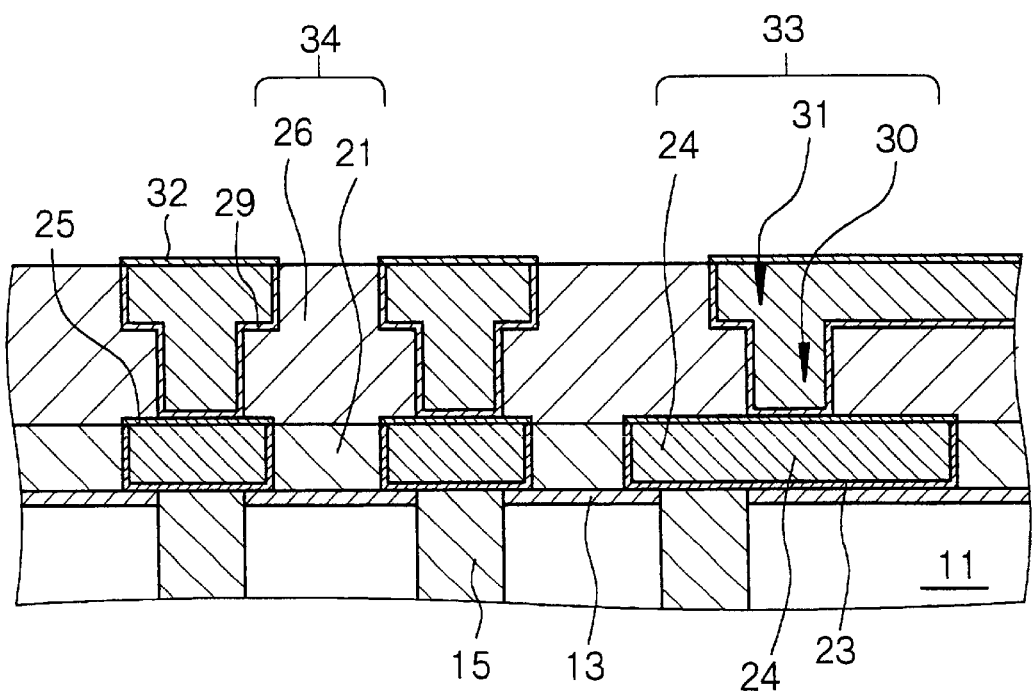

Then, a conventional dual damascene method is carried out. Specifically, a second insulating interlayer 26 composed of silicon oxide ($SiO_2$) is formed on the first insulating interlayer 21 and the second barrier metal layer 25 by, for example, a CVD method. Then, a hole portion 27 and a groove (trench) portion 28 for a wiring line, communicating with the hole portion 27, are formed in the second insulating interlayer 26 by a lithography method and a dry etching method (see. FIG. 2A). Then, a third barrier metal layer 29 composed of tantalum nitride is formed on the entire surface including inside surfaces of the groove portion 28 and the hole portion 27. And, after a copper layer is formed on the second insulating interlayer 26 including the insides of the groove portion 28 and the hole portion 27, the copper layer and the third barrier metal layer 29 on the second insulating interlayer 26 are removed, for example, by a CMP method, to form a plug 30 composed of copper in the hole portion 27 and to form a second wring 31 composed of copper in the groove portion 28. Then, a fourth barrier metal layer 32 composed of cobalt-tungsten-phosphorus (CoWP) is formed on the second wiring 31, for example, by a selective growth method (see FIG. 2B). The second wiring 32 and the plug 30 as a whole are in a state where they are covered with the third barrier metal layer 29 and the fourth barrier metal layer 32.

In the above manner, wirings 33 made of the first wiring 24, the plug 30 and the second wiring 31 and the first insulating layer 34 made of the first insulating interlayer 21 and the second insulating interlayer 26 filling spaces between the wirings 33 are formed on the substratum 11.

[Step-130]

Figure 3A:
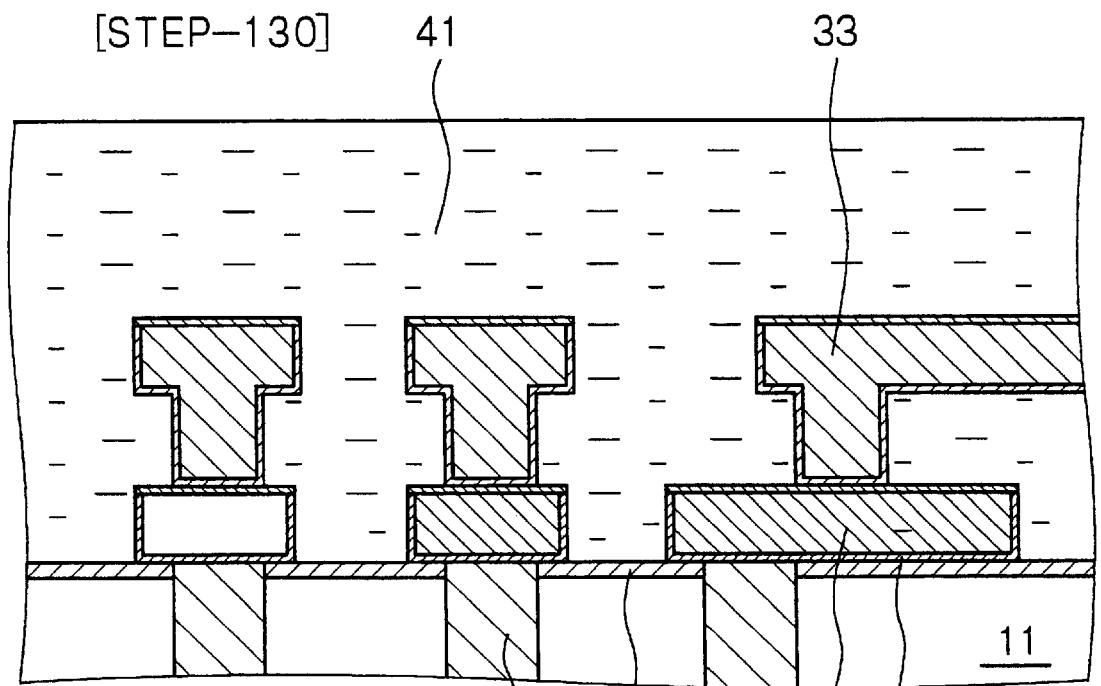
FIGS. 3A and 3B, following
Figure 3B:
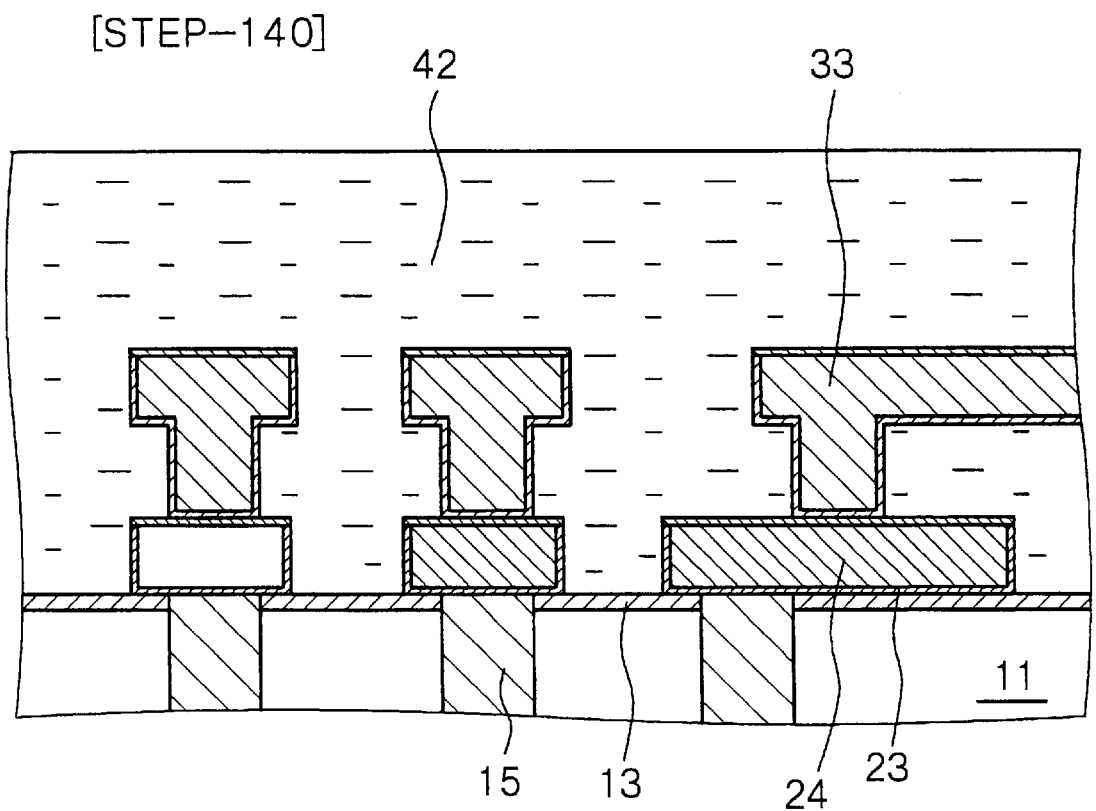
Figure 4A:
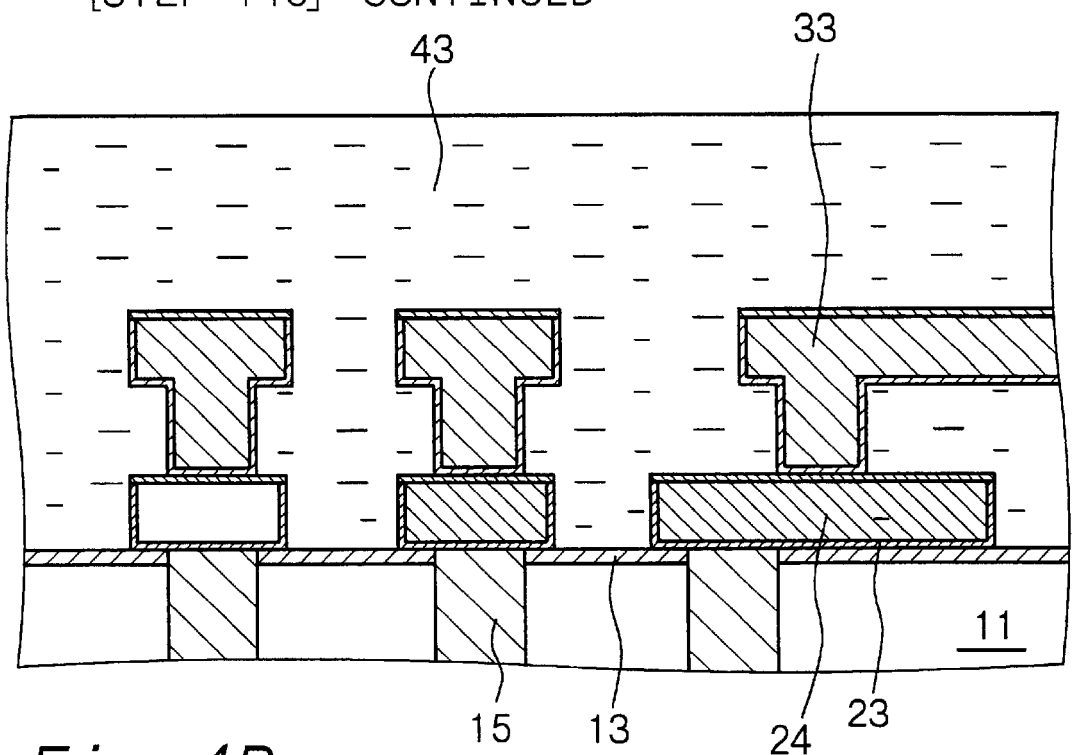
FIGS. 4A and 4B, following
Figure 4B:
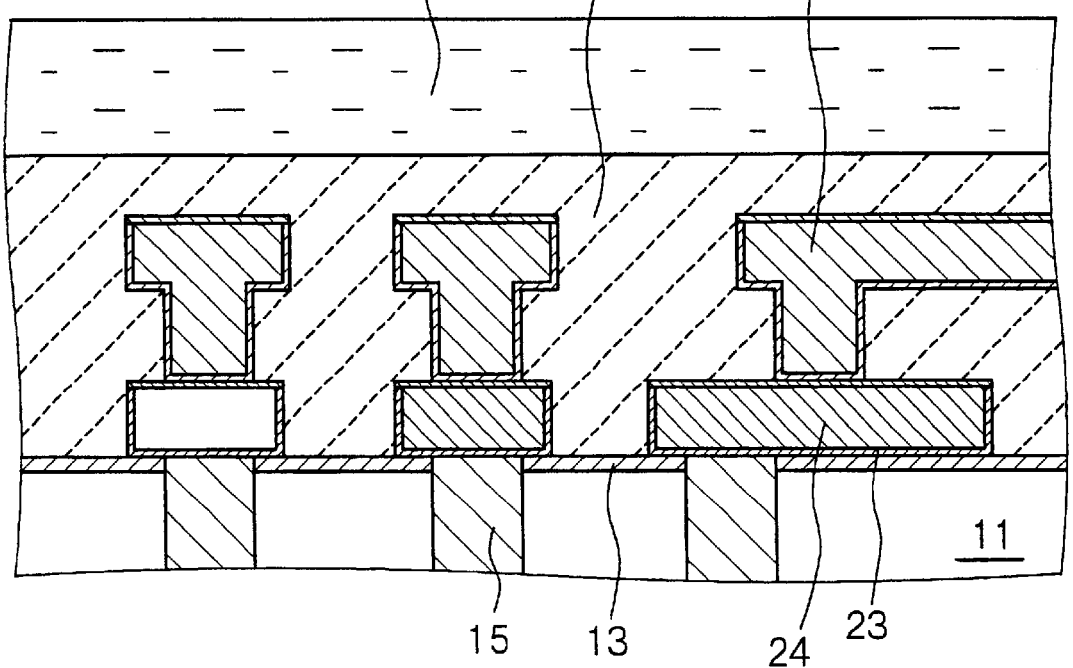

Then, the first insulating layer 34 is immersed in a fluid (first-insulating-layer dissolving fluid) 41 which dissolves the first insulating layer 34, to dissolve the first insulating layer 34 into the fluid 41 (see FIG. 3A). As the first-insulating-layer dissolving fluid 41, for example, a 0.5 wt % hydrofluoric acid aqueous solution can be used. When the first insulating layer 34 is composed of a silicon oxide material (specifically, $SiO_2$ in Example 1), an aqueous solution containing fluorine (specifically, hydrofluoric acid aqueous solution) is used as the first-insulating-layer dissolving fluid 41, whereby the first insulating layer 34 can be dissolved.

[Step-140]

After the first insulating layer 34 is completely dissolved into the first-insulating-layer dissolving fluid 41, the first-insulating-layer dissolving fluid 41 is replaced with a raw material solution containing a raw material for forming a second insulating layer without bringing the wiring 33 into contact with any gas. Specifically, the first-insulating-layer dissolving fluid 41 is replaced with pure water (for example, ultrapure water) without bringing the wiring 33 into contact with any gas, whereby the first-insulating-layer dissolving fluid 41 can be removed from the surface of the substratum 11. Then, the ultrapure water is replaced with an alcohol solvent 42 without bringing the wiring 33 into contact with any gas (see FIG. 3B). In this embodiment, methyl alcohol is used as an alcohol solvent 42. Then, the alcohol solvent is replaced with the raw material solution 43 containing a raw material for forming the second insulating layer without bringing the wiring 33 into contact with any gas (see FIG. 4A). As a raw material solution, for example, there can be used a solution containing an organic polymer obtained by hydrolyzing a silicon alkoxide and dehydration-condensing the resultant silicon hydroxide, specifically, a solution containing tetraethoxysilane (TEOS). pH adjusters such as water and/or ammonia required for the dehydration/condensation may be separately fed in the form of steam and/or ammonia gas after the alcohol solvent 42 is replaced with the solution containing silicon hydroxide.

A series of the above substituting steps are carried out without bringing the wiring 33 into contact with any gas, where no gas/liquid interface is formed on the wiring 33. Therefore, no mechanical stress caused by a surface tension takes place on the wiring 33, 50 that the wiring 33 is not damaged.

[Step-150]

As the raw material solution 43 undergoes dehydration/condensation, it forms a so-called a sol. As the dehydration/condensation proceeds further, a second insulating layer (wet gel 44) formed by gelation in the raw material solution 43 is filled between the wirings 33 (and on the wiring 33 as well in Example 1) (see FIG. 4B). Then, the raw material solution 43 is dried off, to form the second insulating layer at least between the wirings 33. Specifically, the substratum 11 is transferred, for example, into a third-structured apparatus to be explained in Example 4 later, and then, the solvent in the raw material solution 43 is replaced with a supercritical fluid 45 by a supercritical drying method using the supercritical fluid 45 (see FIG. 5A), to remove the solvent in the wet gel 44. The supercritical fluid 45 can be selected from a supercritical fluid of carbon dioxide ($CO_2$) or a supercritical fluid of an alcohol such as methyl alcohol or ethyl alcohol. The supercritical drying method refers to a method in which a wet gel is dried at a temperature under a pressure equal to, or higher than, the critical point of the solvent, and the solvent under high-temperature and high-pressure conditions equal to, or higher than, its critical point has a supercritical state in which a gas and a liquid are undistinguishable. When the solvent in the wet gel 44 is removed in such a state, a gas/liquid interface is not formed in the gel, so that no mechanical stress caused by a surface tension is caused on the sol structure, whereby the solvent can be dried off almost without shrinking the wet gel. For example, when ethyl alcohol is used as a supercritical fluid, there can be employed procedures of maintaining the ethyl alcohol at 260° C. under a pressure of $8 \times 10^6$ Pa for 1 hour, then, reducing the pressure to 1 atmospheric pressure with retaining the temperature of 260° C., and then decreasing the temperature from 260° C. to room temperature (for example, 20° C.).

Figure 5A:
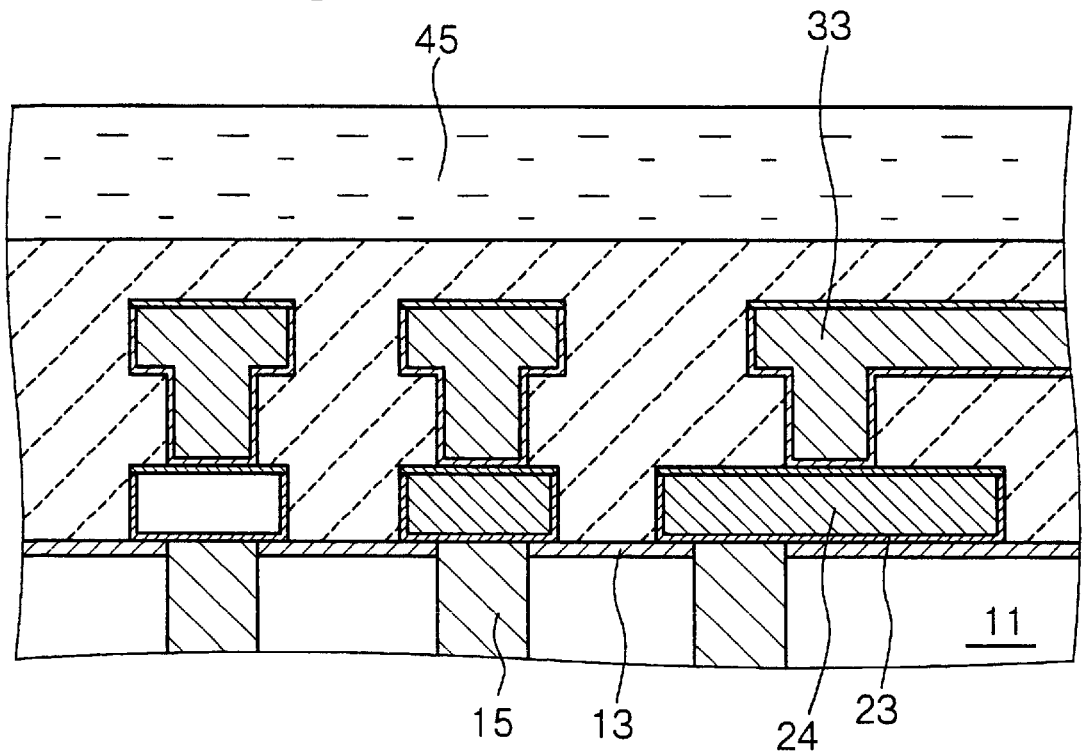
FIGS. 5A and 5B, following
Figure 5B:
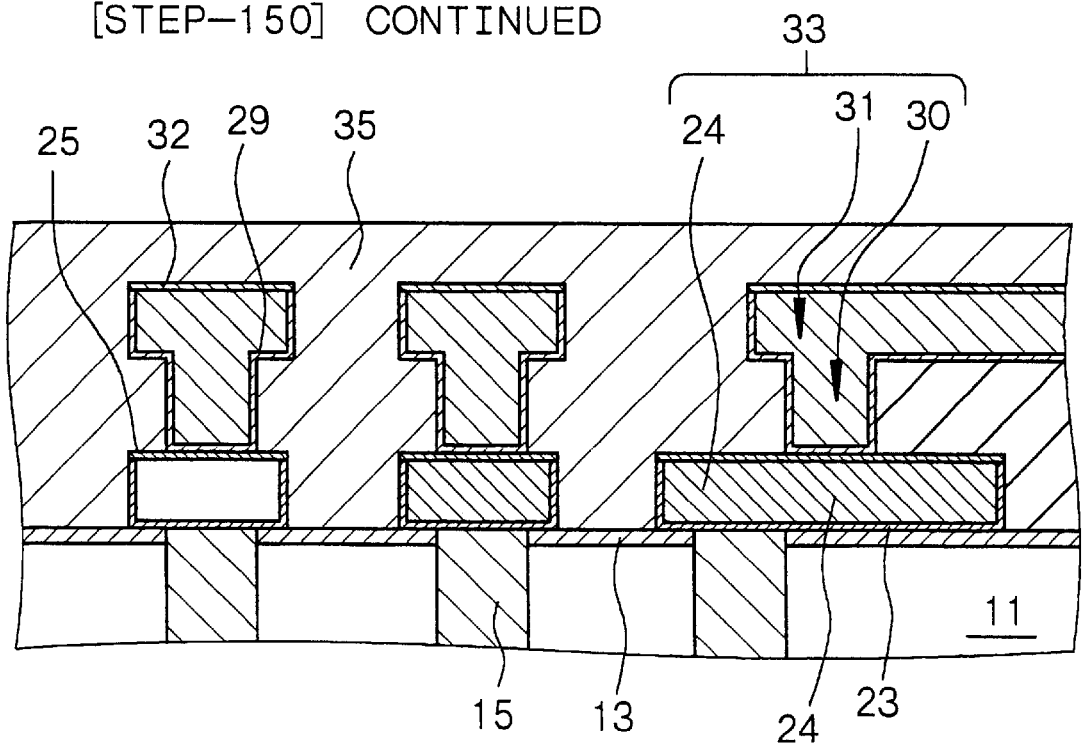

In the above manner, a dry second insulating layer 35 composed of a porous organic insulating material having a porosity of about 50% or more is formed in a state where it is filled between the wirings 33, and it is also formed on the wiring 33, as shown in FIG. 5B.

In the above embodiment, tetraethoxysilane (TEOS) is used as a raw material for the second insulating layer 35 which is a porous insulating layer. It has been found that an alkoxysilane [$H_xSi(OR)_{4-x}$ in which x=1, 2 or 3 and R is an alkyl group] such as tetramethoxysilane or triethoxysilane has an effect of decreasing the reaction temperature for obtaining silicon oxide.

In Example 1, the raw material solution 43 is dried by the drying method using the supercritical fluid. In the step of drying the raw material solution 43, alternatively, the solvent in the raw material solution 43 may be dried off under atmosphere having a pressure equal to, or lower than, atmospheric pressure.

Further, the raw material solution 43 may be a solution of carbon and a fluorine-containing organic polymer or a condensate thereof in a solvent such as an alcohol, cyclohexanone, xylene, acetone or toluene. In this case, the raw material solution can be dried by a method in which the solvent in the raw material solution 43 is dried off with a supercritical fluid or a method in which the solvent in the raw material solution is dried off under atmosphere having a pressure equal to, or lower than, atmospheric pressure. In this manner, the dry second insulating layer 35 is also formed in a state where it is filled between the wirings 33, and further, it is formed on the wiring 33.

Further, the first insulating interlayer 21 and the second insulating interlayer 26 can be formed of an organic insulating layer such as a polyaryl ether layer. In this case, the first-insulating-layer dissolving fluid can be selected from an amine-containing alkali aqueous solution, a nitric acid aqueous solution or a mixture containing hydrofluoric acid and nitric acid. Otherwise, as a first-insulating-layer dissolving fluid, there can be used a supercritical fluid of water, carbon dioxide, methyl alcohol, ethyl alcohol or oxygen. When the first insulating layer 34 (the first insulating interlayer 21 and the second insulating interlayer 26) is composed of an organic insulating layer, a fluid which does not dissolve a silicon oxide layer ($SiO_2$ layer) can be used as a first-insulating-layer dissolving fluid 41, and in this case, the protective layer 13 can be composed of a silicon oxide layer. In some case, the protective insulating layer 13 may be omitted. The first insulating layer 34 formed of the first insulating interlayer 21 and the second insulating interlayer 26 is dissolved into the first-insulating-layer dissolving fluid, so that it causes no problem to polish the first insulating layer 34 by a CMP method.

In the above-explained method of forming a buried wiring, provided by the present invention, since the wiring 33 is buried in the second insulating layer 35, it is not required to carry out dry-etching of the second insulating layer 35. It is therefore not necessary to form a resist mask for the dry etching on the second insulating layer 35, and there is caused no problem that the second insulating layer 35 is damaged by the removal of the resist mask. Further, since it is not necessary to apply a CMP method to the second insulating layer 35, the second insulating layer 35 suffers no shear stress and is therefore free from breaking caused by the shear stress.

Further, since the first-insulating-layer dissolving fluid 41 which has dissolved the first insulating layer 34 is replaced with the raw material solution 43 without exposing the wiring 33 to any gas, no water droplets are formed between the wirings 33. There is therefore caused no phenomenon that a stress is caused between the wirings 33 due to a surface tension of the water droplets, mechanically deforms the wiring 33 and ultimately breaks it.

Further, the second insulating layer 35 in the form of a gel is formed between the wirings 33 in the raw material solution 43 while the wirings 33 are covered with the raw material solution 43, and then the raw material solution 43 is dried, so that the insulating layer 35 is reliably filled between the wirings 33 equally at lower and upper levels. There is therefore no hollow portion where no second insulating layer 35 is formed between the wirings 33 after the solvent in the raw material solution 43 is dried off. Since regions between the wirings 33 are fully filled with the second insulating layer 35 as described above, there is no case where the wiring vibrates due to a change in Coulomb force between the wirings 33, wiring lines in particular.

Further, since the protective insulating layer 13 is formed on the substratum 11 for protecting the substratum 11 from the first-insulating-layer dissolving fluid 41 before the wiring 33 is formed on the substratum 11, the substratum 11 is protected by the protective insulating layer 13 when the first insulating layer 34 is dissolved. For example, when a hydrofluoric acid aqueous solution is used as a first-insulating-layer dissolving fluid 41 as described above, the plug 15 (for example, tungsten plug) and the protective insulating layer 13 formed between a device-forming region such as a transistor-forming region and a wiring region work as a barrier against the penetration of the hydrofluoric acid aqueous solution. Therefore, the device-forming region such as a transistor-forming region is not at all affected by the etching action of the hydrofluoric acid aqueous solution.

EXAMPLE 2

Examples 2 to 4 to be described hereinafter are concerned with the apparatus for processing a substratum of the present invention. The apparatus for processing a substratum of the present invention is an apparatus for removing a first insulating layer filled between wirings formed on a substratum, and then, forming a second insulating layer at least between the wirings. The apparatus for processing a substratum comprises:

(a) first-insulating-layer removing means for immersing the first insulating layer in a fluid which can dissolves the first insulating layer, to dissolve the first insulating layer into the fluid, (b) raw-material-solution substituting means for substituting, for the fluid, a raw material solution containing a raw material for forming the second insulating layer, and (c) drying means for drying off the raw material solution, thereby to form the second insulating layer at least between the wirings.

Example 2 is concerned with the first-structured apparatus for constituting the apparatus for processing a substratum of the present invention. The first-structured apparatus will be referred to as "first processing apparatus" hereinafter. The first processing apparatus of Example 2 is a single wafer processing apparatus, which can be used for carrying out the steps (B) and (C) and the step of filling the second insulating layer formed by gelation in the raw material solution at least between the wirings (to be referred to as "filling step in the step (D)" hereinafter) out of the step (D) in the method of forming a buried wiring in the present invention.

Figure 6:
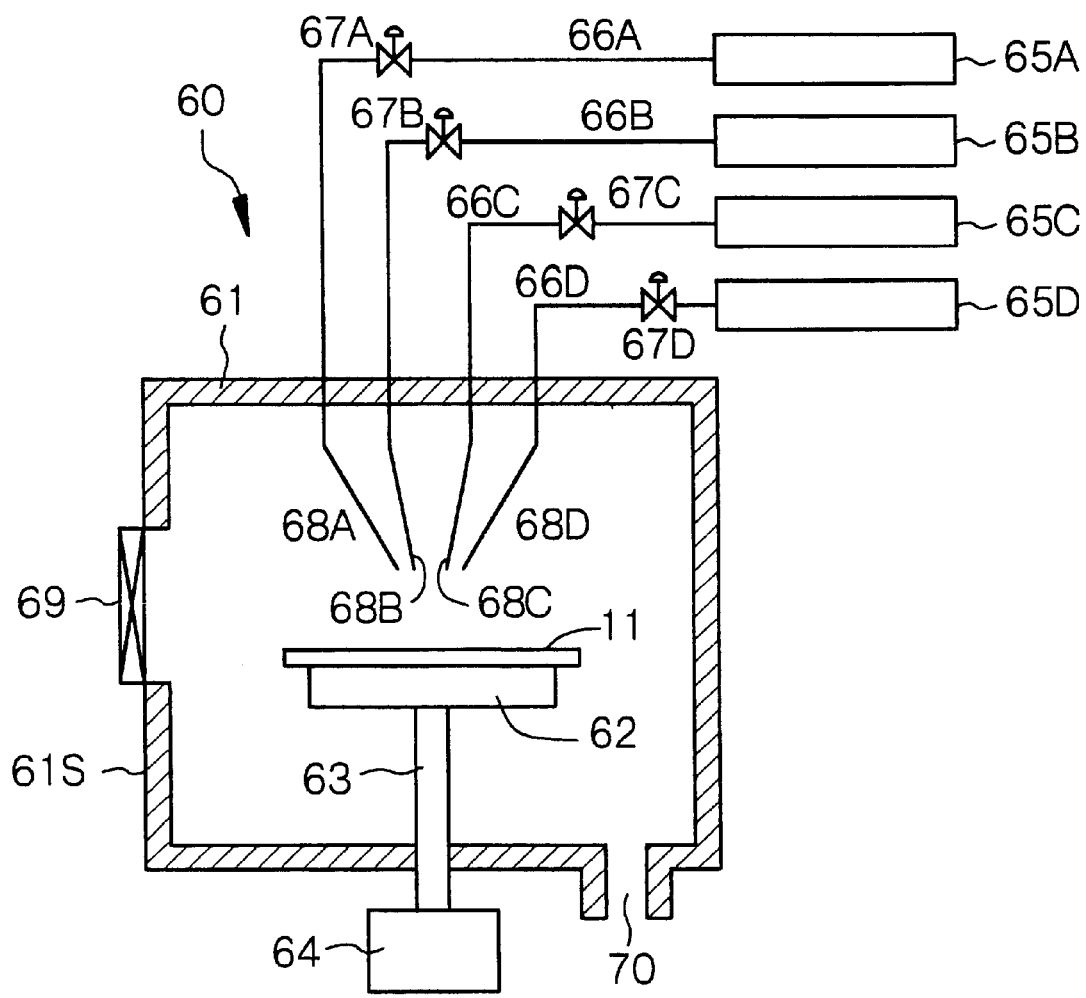
FIG. 6 is a conceptual view of a first processing apparatus in Example 2.

FIG. 6 shows a conceptual view of the first processing apparatus 60 of single wafer processing apparatus type, in which the first-insulating-layer removing means and the raw-material-solution substituting means are constituted of one process chamber 61. The process chamber 61 has a substratum supporting stage 62 and a substratum transfer portion 69 comprising a gate valve. The substratum supporting stage 62 is disposed in the process chamber 61, and the substratum 11 (more specifically, a semiconductor substrate) is placed thereon by vacuum suction. That is, the substratum supporting stage 62 has a so-called vacuum suction chuck mechanism. The substratum transfer portion 69 is provided in one side wall 61S of the process chamber 61, and it is used for transferring the substratum 11 into, and out of, the process chamber 61 through it. A rotary driving portion 64 is connected to the substratum supporting stage 62 through a rotary shaft 63. Outside the process chamber 61, there is provided a substratum transfer robot as a substratum transfer apparatus (not shown) for transferring the substratum 11 into, and out of, the process chamber 61. A discharge port 70 for discharging a solution is provided, for example, in a bottom of the process chamber 61.

The first-insulating-layer removing means further has a first-insulating-layer dissolving fluid supply source (hydrofluoric acid aqueous solution supply source) 65A for supplying the fluid 41 for dissolving the first insulating layer 34, a piping 66A connected to the first-insulating-layer dissolving fluid supply source 65A, and a nozzle 68A which is connected to the piping 66A through a valve (shut-off valve) 67A, is disposed in the process chamber 61 and is used for supplying the first-insulating-layer dissolving fluid 41 to the substratum 11. The nozzle 68A is arranged above the substratum supporting stage 62.

Further, the raw-material-solution substituting means has processing fluid supply sources 65B, 65C and 65D, pipings 66B, 66C and 66D connected to the processing fluid supply sources 65B, 65C and 65D, respectively, and nozzles 68B, 68C and 68D. The nozzles 68B, 68C and 68D are connected to the pipings 66B, 66C and 66D through valves 67B, 67C and 67D, respectively, are disposed in the process chamber 61, and are used for supplying processing fluids to the substratum 11. Specifically, the nozzle 68B is connected to the processing fluid supply source (pure water supply source 65B) through the piping 66B and the valve 67B. The nozzle 68C is connected to the processing fluid supply source (alcohol solvent supply source 65C) through the piping 66C and the valve 67C. The nozzle 68D is connected to the processing fluid supply source (supply source 65D for supplying a raw material solution containing a raw material for forming the second insulating layer) through the piping 66D and the valve 67D. Further, the nozzles 68B, 68C and 68D are arranged above the substratum supporting stage 62.

In the first processing apparatus 60 or a variant 60A of the first processing apparatus, to be explained later, the characteristic feature is that a plurality of fluids can be fed on the substratum 11 and substituted in one apparatus. In the first processing apparatus 60 or 60A, a mixture of a plurality of fluids may be fed on the substratum 11 as required.

Figure 7:
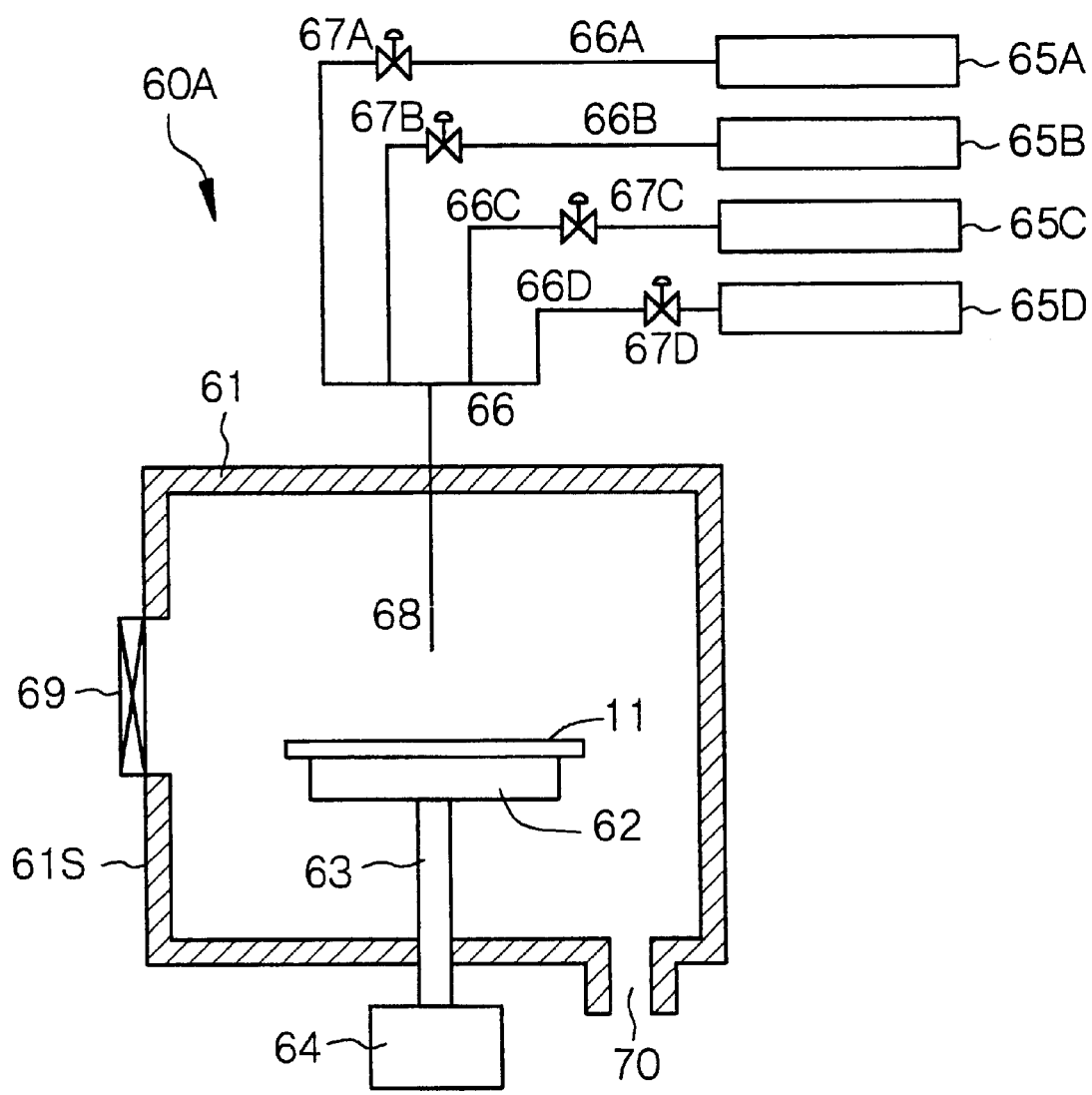
FIG. 7 is a conceptual view of a variant of the first processing apparatus in Example 2.

FIG. 7 shows a conceptual view of a variant of the first processing apparatus shown in FIG. 6. The first processing apparatus 60A shown in FIG. 7 differs from the first processing apparatus 60 shown in FIG. 6 in that a plurality of the nozzles are integrated into one nozzle 68. That is, the first-insulating-layer dissolving fluid supply source 65A is connected to the nozzle 68 through the piping 66A, the valve (shut-off valve) 67A and a piping 66, the pure water supply source 65B is connected to the nozzle 68 through the piping 66B, the valve 67B and the piping 66, the alcohol solvent supply source 65C is connected to the nozzle 68 through the piping 66C, the valve 67C and the piping 66, and supply source (raw-material-solution supply source) 65D for supplying a raw material solution containing a raw material for forming the second insulating layer is connected to the nozzle 68 through the piping 66D, the valve 67D and the piping 66. Each fluid or solution can be fed on the substratum 11 through each route, so that each fluid or solution is not mixed with the other before fed on the substratum 11.

The method of forming a buried wiring with the first processing apparatus 60 shown in FIG. 6, provided by the present invention, will be explained hereinafter. Further, the method using the first processing apparatus 60A shown in FIG. 7 can be also carried out in the same manner.

First, the valves 67A to 67D are kept closed. The substratum 11 to be processed is transferred into the process chamber 61 through the substratum transfer portion 69 and is placed and fixed on the substratum supporting stage 62 by vacuum suction. Then, the substratum transfer portion 69 is closed to close the process chamber 61.

Then, the valve 67A is opened to supply a hydrofluoric acid aqueous solution onto the substratum 11 from the first-insulating-layer dissolving fluid supply source 65A through the piping 66A and the nozzle 68A. Thereafter, the valve 67A is closed. And, after the first insulating layer is completely dissolved into the hydrofluoric acid aqueous solution, the valve 67B is opened, and pure water is fed onto the substratum 11 from the pure water supply source 65B through the piping 66B and the nozzle 68B, to substitute the pure water for the hydrofluoric acid aqueous solution. When the hydrofluoric acid aqueous solution is completely replaced with the pure water, the valve 67B is closed to stop the supplying of pure water. While the pure water is substituted, the hydrofluoric acid aqueous solution and the pure water are discharged through the discharge port 70.

Then, the valve 67C is opened, and an alcohol (for example, methyl alcohol) is fed onto the substratum 11 from the alcohol solvent supply source 65C through the piping 66C and the nozzle 68C, to substitute the methyl alcohol for the pure water. When the methyl alcohol is completely substituted, the valve 67C is closed to stop the supplying of methyl alcohol. While the methyl alcohol is substituted, the pure water and the methyl alcohol are discharged through the discharge port 70. Then, the valve 67D is opened, and a raw material solution is fed onto the substratum 11 from the raw-material-solution supply source 65D through the piping 66D and the nozzle 68D, to substitute the raw material solution for the methyl alcohol. When the raw material solution is completely substituted, the valve 67D is closed to stop the supplying of the raw material solution, and a state where the raw material solution covers the substratum 11 is maintained for a predetermined period of time. While the raw material solution is substituted, the methyl alcohol and the raw material solution are discharged through the discharge port 70.

Then, the substratum 11 is transferred into a drying step, and dried, in a state where the raw material solution covers the substratum 11, that is, without bringing the wiring 33 into contact with any gas. The drying is carried out, for example, with the third-structured apparatus to be explained in Example 4.

EXAMPLE 3

Example 3 is concerned with the second-structured apparatus for constituting the apparatus for processing a substratum of the present invention. The second-structured apparatus will be referred to as a "second processing apparatus" hereinafter. The second processing apparatus of Example 3 is a single wafer processing apparatus, and the steps (B) and (C) and the filling step in the step (D) in the method of forming a buried wiring in the present invention are carried out with separate second processing apparatus.

Figure 8:
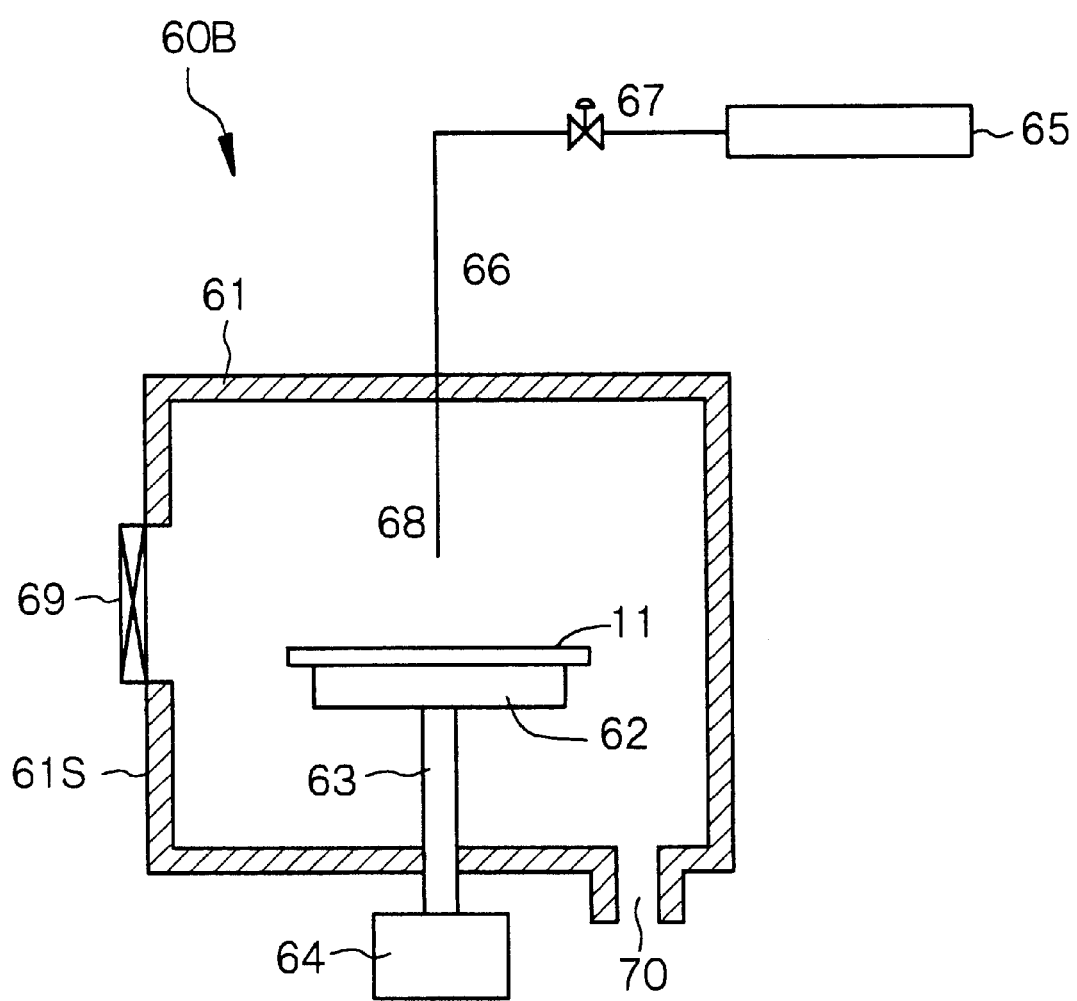
FIG. 8 is a conceptual view of a second processing apparatus in Example 3.

Each of the first-insulating-layer removing means and the raw-material-solution substituting means has a process chamber 61; a substratum supporting stage 62 which is disposed in the process chamber 61 and is used for supporting a substratum 11 thereon; a substratum transfer portion 69 provided in the process chamber 61; a fluid supply source 65 of a fluid for dissolving the first insulating layer or processing fluids for carrying out various processes (these fluids will be sometimes generically referred to as "processing fluid" hereinafter); a piping 66 connected to the fluid supply source 65; and a nozzle 68 which is connected to the piping 66 through a valve 67, is disposed in the process chamber 61 and is for supplying the processing fluid to the substratum. FIG. 8 shows a structure of the second processing apparatus 60B, and in principle, the second processing apparatus 60B can be substantially structurally the same as that of the first processing apparatus 60 explained in Example 2.

The fluid supply source 65 preserves, for example, one of hydrofluoric acid, pure water, an alcohol solvent, a raw material solution containing a raw material for forming the second insulating layer, and the like. In the second processing apparatus 60B, processing of one kind only is carried out, so that the contamination of one processing fluid with other processing fluid can be prevented. When continuous processing is carried out in series, the second processing apparatus 60B in the number corresponding to the number of the processing in series can be provided. The substratum 11 can be transferred from one second processing apparatus 60B to another second processing apparatus 60B with a substratum transfer unit (not shown) through the substratum transfer portions 69 of the second processing apparatus 60B. In this case, the substratum 11 is transferred in a state where the processing fluid fed from the nozzle 68 covers the substratum 11, whereby the exposure of the wiring 33 to ambient gas can be prevented.

Figure 9:
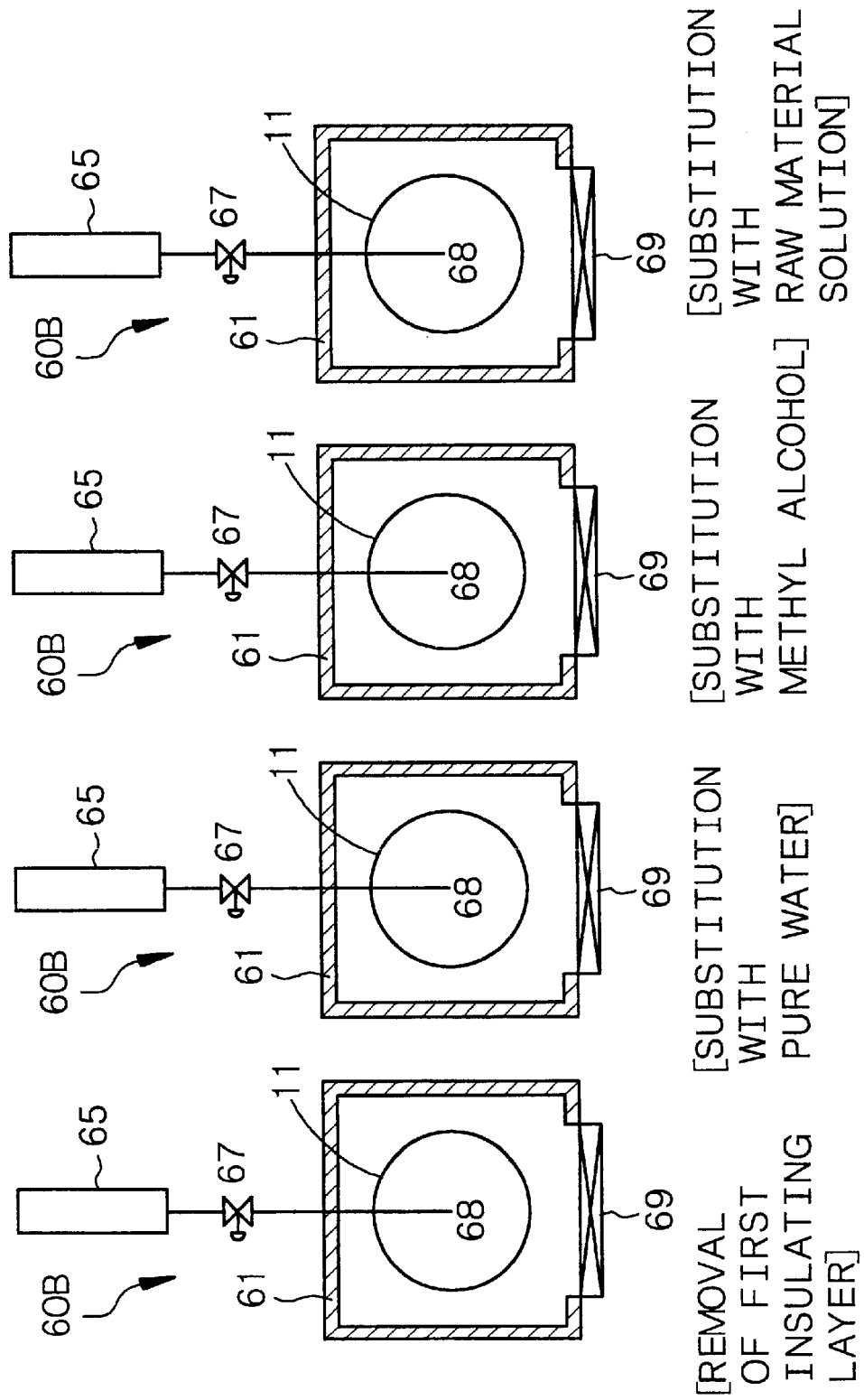
FIG. 9 is a conceptual view of an apparatus for processing a substratum in Example 3.

The method of forming a buried wiring with the second processing apparatus 60B shown in FIGS. 8 and 9, provided by the present invention, will be explained hereinafter.

When the first-insulating-layer dissolving fluid 41 is fed, the fluid supply source 65 preserves, for example, a hydrofluoric acid aqueous solution. The valve 67 is kept closed. And, the substratum 11 to be processed is transferred into the process chamber 61 through the substratum transfer portion 69 and is placed and fixed to the substratum supporting stage 62 by vacuum suction. Then, the substratum transfer portion 69 is closed to close the process chamber 61. Then, a hydrofluoric acid aqueous solution is fed onto the substratum 11 from the fluid supply source 65 through the piping 66, the valve 67 and the nozzle 68. Then, the valve 67 is closed. And, after the first insulating layer is completely dissolved into the hydrofluoric acid aqueous solution, the substratum 11 in a state where the hydrofluoric acid aqueous solution covers it is transferred out of the process chamber 61 through the substratum transfer portion 69, and transferred to a next step of substitution with pure water.

When pure water is substituted, another second processing apparatus 60B is used, which is different from the second processing apparatus 60B used for the processing with hydrofluoric acid. The fluid supply source 65 of the second processing apparatus 65B preserves, for example, pure water. The valve 67 is kept closed. And, the substratum 11 to be processed (for example, the substratum 11 in a state where it is covered with the hydrofluoric acid aqueous solution) is transferred into the process chamber 61 through the substratum transfer portion 69 and is placed and fixed on the substratum supporting stage 62 by vacuum suction. Then, the substratum transfer portion 69 is closed to close the process chamber 61. Then, pure water is fed onto the substratum 11 from the fluid supply source 65 through the piping 66, the valve 67 and the nozzle 68, to substitute the pure water for the hydrofluoric acid aqueous solution. When the substitution with the pure water is completed, the valve 67 is closed. While the pure water is substituted, the hydrofluoric acid aqueous solution and the pure water overflowing the substratum 11 are discharged through the discharge port 70. Then, the substratum 11 in a state where it is covered with the pure water is transferred out of the process chamber 61 through the substratum transfer portion 69, and is transferred to a next step of substitution with methyl alcohol. The step of substituting methyl alcohol for the pure water can be carried out with another second processing apparatus 60B in the same manner as above. Further, the step of substituting a raw material solution for the methyl alcohol can be also carried out with another second processing apparatus 60B. in the same manner as above. Then, the substratum 11 is transferred to a drying step in a state where it is covered with the raw material solution, that is, without bringing the wiring 33 into contact with any gas, and dried. The drying uses, for example, a third-structured apparatus to be explained in Example 4.

EXAMPLE 4

Example 4 is concerned with the third-structured apparatus for constituting the apparatus for processing a substratum of the present invention. The third-structured apparatus will be referred to as "third processing apparatus" hereinafter. A batch type third processing apparatus 80 of Example 4 differs from the first processing apparatus 60 and 60A in Example 2 or the second processing apparatus 60B in Example 3 in that the batch type third processing apparatus 80 is structured so as to use a supercritical fluid. The third processing apparatus can be used for constituting the first-insulating-layer removing means or the drying means.

Figure 10:
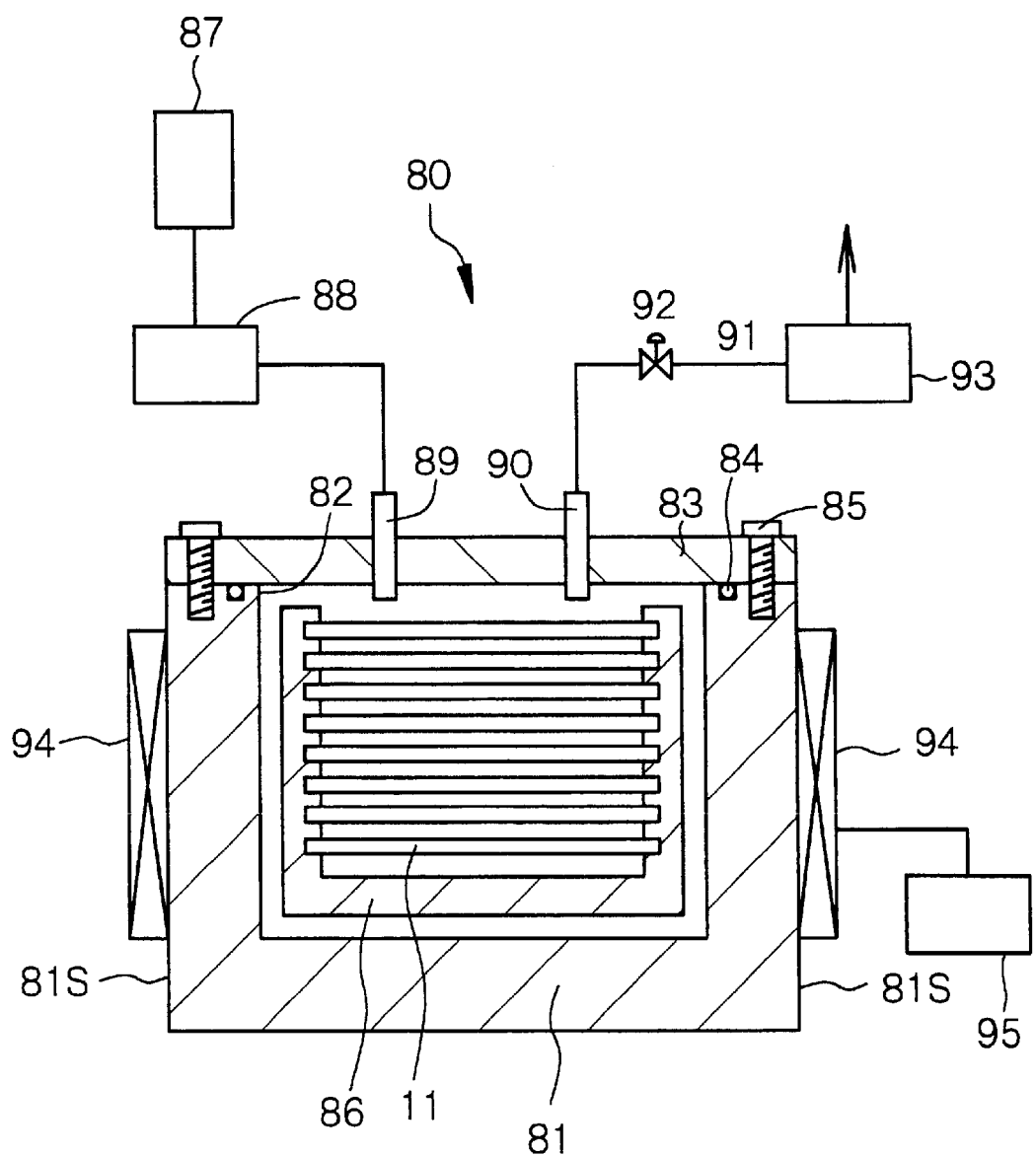
FIG. 10 is a conceptual view of a third processing apparatus in Example 4.

FIG. 10 shows a conceptual view of the third processing apparatus 80, which has a process chamber 81 which has an opening portion 82 and is for receiving the substrata 11 therein; a lid 83 for hermetically closing the opening portion 82; a fluid supply source 87 of a fluid for dissolving the first insulating layer or a fluid for drying the raw material solution (these fluids will be sometimes generically referred to as "processing fluid" hereinafter); a fluid supply means which is connected to the fluid supply source 87 and is used for introducing the processing fluid into the process chamber 81; a fluid discharge means for discharging the processing fluid introduced into the process chamber 81; and a heating means for heating the processing fluid introduced into, and out of, the process chamber 81. The substrata 11 to be processed can be transferred into the process chamber 81 through the opening portion 82. The opening portion 82 is hermetically closed with the lid 83. A seal member 84 made of an "O"-ring is disposed between the process chamber 81 and the lid 83. Further, the lid 83 is fixed to the process chamber 81 with a fastening member (for example, a screw) 85. The interior of the process chamber 81 can be therefore brought into a completely hermetically closed state produced with the lid 83 and the seal member 84. Further, the process chamber 81 can accommodate a substrata holder boat 86 for receiving and holding a plurality of the substrata 11.

The fluid supply means has a pressure-temperature control means 88 which is connected to the fluid supply source 87 and is used for controlling the pressure and temperature of the processing fluid at predetermined levels, and a fluid supply port 89 which is connected to the pressure-temperature control means 88 and is disposed in the process chamber 81. The processing fluid having a pressure and a temperature controlled at predetermined levels with the pressure-temperature control means 88 can be introduced into the process chamber 81 through the fluid supply port 89. The fluid discharge means has a fluid discharge port 90 disposed in the process chamber 81, and a discharged liquid separation apparatus 93 connected to the fluid discharge port 90 through a piping 91 and a discharge pressure valve 92. The discharge pressure valve 92 works to discharge the processing fluid introduced into the process chamber 81 by opening itself when the internal pressure in the process chamber 81 comes to be equal to, or higher than, a predetermined pressure. The pressure and the temperature in the process chamber 81 can be maintained at predetermined levels with the discharge pressure valve 92. In the discharged liquid separation apparatus 93, a pressure of a solvent and/or other substance discharged to a downstream of the discharge pressure valve 92 returns to atmospheric pressure, whereby a medium (for example, alcohol) separated as a liquid is recovered as a discharged liquid, and a substance (for example, carbon dioxide) discharged as a gas is recovered as a discharged gas. The discharged gas is recovered with a gas recovery portion (not shown). The recovered discharged liquid and discharged gas can be recycled after brought into a usable state.

Further, on a side wall 81S of the process chamber 81 is provided a heating means 94 for heating the processing fluid introduced into the process chamber 81 and maintaining it at a predetermined temperature. The heating means 94 can be constituted of a heating medium such as an electrothermal wire. When the heating medium comprises an electrothermal wire, preferably, a power source (not shown) for supplying the electrothermal wire with power is provided outside the process chamber, and a temperature control apparatus 95 is provided for controlling the temperature of the heating means 94 at a predetermined level by controlling the power to be supplied to the electrothermal wire.

The method of drying a raw material solution with a supercritical fluid by the use of the third processing apparatus 80 will be explained hereinafter. The step of immersing the first insulating layer in a first-insulating-layer dissolving fluid, for dissolving the first insulating layer into the fluid, can be also carried out with the third processing apparatus 80. Alternatively, the third processing apparatus can be of single wafer processing apparatus type.

First, the substrata holder boat 86 with a plurality of the substrata 11 which are to be dried (or processed for dissolving the first insulating layers), held thereon, is transferred into the process chamber 81 through the opening portion 82 of the process chamber 81. Then, the lid 83 is closed to hermetically close the process chamber 81. Then, a predetermined processing fluid is introduced into the process chamber 81 from the fluid supply source 87. Specifically, a supercritical fluid supplied from the processing fluid supply source 87 is adjusted to a predetermined pressure and a predetermined temperature with the pressure-temperature control means 88 and is introduced into the process chamber 81 through the supply port 89. In this case, the processing fluid introduced into the process chamber 81 is heated with the heating means 94, to maintain the temperature of the processing fluid in the process chamber 81 at a predetermined level. The processing fluid is temperature-controlled with the temperature control apparatus 95.

Then, the raw material solution which covers the substrata 11 is replaced with the supercritical fluid. Otherwise, the first insulating layers are immersed in the first-insulating-layer dissolving fluid, to dissolve the first inlayers into the first-insulating-layer dissolving fluid. In this case, when the internal pressure in the process chamber 81 comes to be equal to, or higher than, a predetermined pressure, the discharge pressure valve 92 is opened to discharge the processing fluid (the supercritical fluid, or the raw material solution and the supercritical fluid, or the first-insulating-layer dissolving fluid) out of the system through the discharged liquid separation apparatus 93. In this manner, the processing fluid charged in the process chamber 81 is discharged as required, whereby the pressure and the temperature in the process chamber 81 can be maintained at constant levels.

In the discharged liquid separation apparatus 93, a pressure of a solvent or other substance discharged to a downstream of the discharge pressure valve 92 returns to atmospheric pressure, whereby a medium (for example, alcohol) to be separated as a liquid is recovered as a discharged liquid. A substance (for example, carbon dioxide) to be discharged as a gas is recovered as a discharged gas. The recovered discharged liquid and discharged gas can be recycled after brought into a usable state.

When, for example, ethyl alcohol is used as a supercritical fluid in the supercritical drying, the ethyl alcohol having, for example, a temperature of 260° C. and a pressure of 8 MPa is maintained in this state for 1 hour, and then pressure-decreased to atmospheric pressure while maintaining its temperature at 260° C. Then, the temperature thereof is decreased from 260° C. to room temperature (for example, 20° C.). In this manner, the interior in the process chamber 81 is brought into a dry state, and the solvent in the raw material solution is removed. Through the above supercritical drying, the porous second insulating layer having a high porosity can be dried without shrinking it. Further, when water ($H_2O$) is used as a supercritical fluid for dissolving the first insulating layer in the fluid, water having a temperature of 400° C. and a pressure of 29 MPa is maintained in this state for 1 hour and, then, the temperature thereof is decreased from 400° C. to room temperature (for example, 20° C.) while maintaining its pressure at 29 MPa. Then, the pressure thereof is decreased to atmospheric pressure. When other fluids are used as a supercritical fluid, dissolution of the first insulating layer into the fluid can be carried out under proper pressure and temperature conditions for the fluid used.

Constitution examples of the apparatus for processing a substratum when the method of forming a buried wiring in the present invention is carried out with the first to third processing apparatus explained in Examples 2 to 4 will be explained with reference to block diagrams shown in FIGS. 11 to 20.

Figure 11:
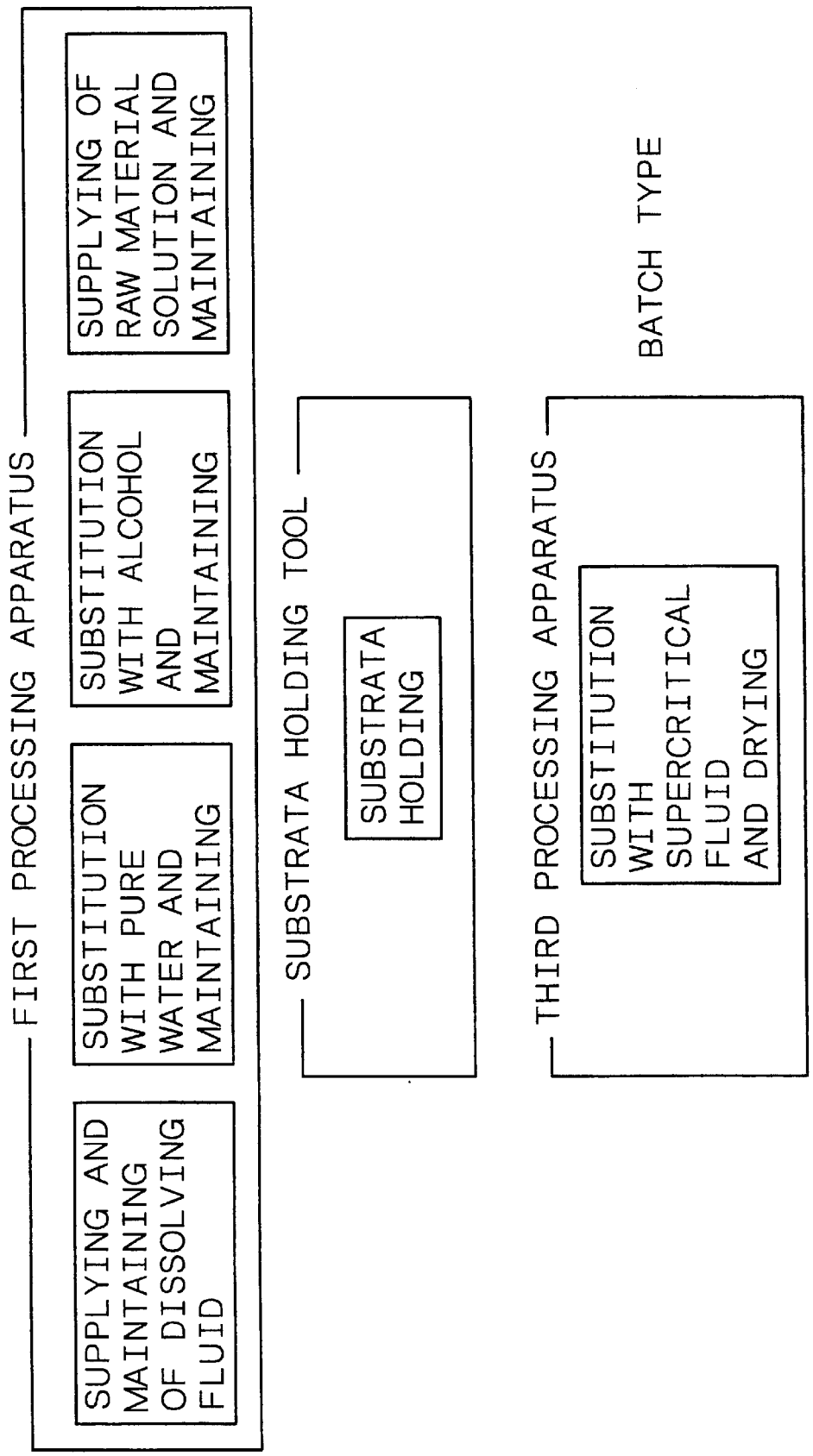
FIG. 11 is a block diagram of a constitution example of an apparatus for processing a substratum for carrying out the method of forming a buried wiring in the present invention.

In the constitution example of the apparatus for processing a substratum shown in FIG. 11, the first processing apparatus 60 or 60A explained in Example 2 is used to carry out the steps (B) and (C) and the filling step in the step (D). In the block diagrams, the step (B) is shown as "SUPPLYING OF DISSOLVING FLUID AND MAINTAINING", the step (C) is shown as "SUBSTITUTING WITH PURE WATER AND MAINTAINING" and "SUBSTITUTION WITH ALCOHOL AND MAINTAINING", and the filling step in the step (D) is shown as "SUPPLYING OF RAW MATERIAL SOLUTION AND MAINTAINING". Then, the substrata 11 are held with a substrata holding tool, such as a substrata holder boat 86, capable of holding a plurality of the substrata 11. In the block diagrams, this step is shown as "SUBSTRATA HOLDING". And, the drying of the raw material solution in the step (D) is carried out with the third processing apparatus 80 explained in Example 4. In the block diagrams, this step is shown as "SUBSTITUTION WITH SUPERCRITICAL FLUID AND DRYING". Alternatively, the third processing apparatus of single wafer processing apparatus type can be used.

Figure 12:
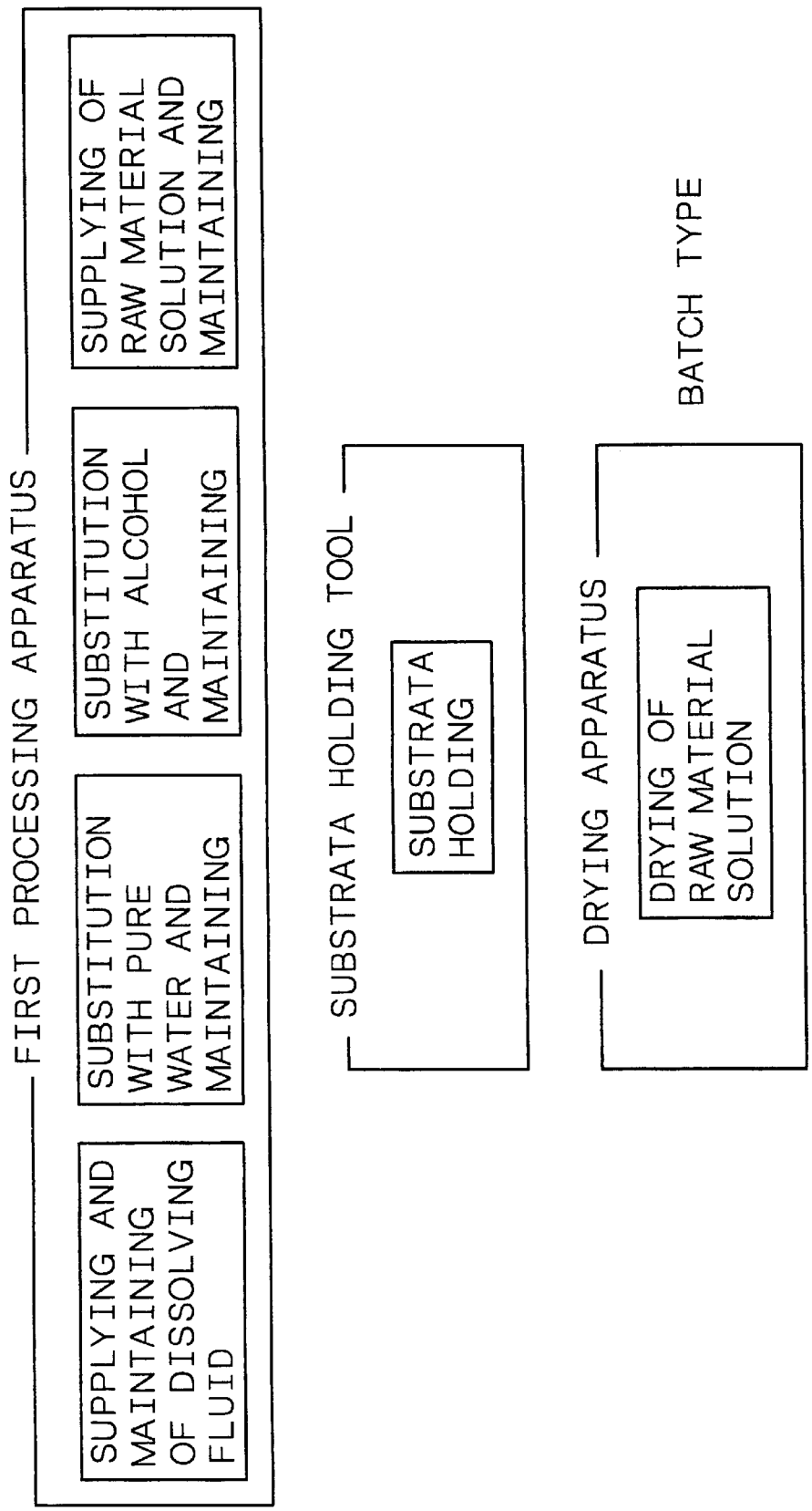
FIG. 12 is another block diagram of a constitution example of an apparatus for processing a substratum for carrying out the method of forming a buried wiring in the present invention.

In the constitution example of the apparatus for processing a substratum shown in FIG. 12, the drying of the raw material solution in the step (D) is carried out with a known batch type drying apparatus (not shown) instead of employing the drying step using the third processing apparatus 80 in the constitution example of the apparatus for processing a substratum shown in FIG. 11. In the block diagrams, this step is shown as "DRYING OF RAW MATERIAL SOLUTION". Specifically, the substrata holder boat 86 with a plurality of substrata 11 (semiconductor substrates) held thereon is transferred into the drying apparatus, and the interior of the drying apparatus is brought into an atmospheric-pressure atmosphere or a reduced-pressure atmosphere to dry the raw material solution. When the raw material solution is dried, the second insulating layer in a wet gelled state is formed between the wirings, so that the wiring is neither broken nor damaged. Alternatively, the drying apparatus of single wafer processing apparatus type can be used.

In the constitution example of the apparatus for processing a substratum shown in FIG. 13, the steps (B) and (C) and the filling steps in the step (D) are carried out with a plurality of the second processing apparatus 60B explained in Example 3. Then, the substrata 11 are held with a substrata holding tool, such as a substrata holder boat 86, capable of holding a plurality of substrata 11. And, the drying of the raw material solution in the step (D) is carried out with the third processing apparatus 80 explained in Example 4.

In the constitution example of the apparatus for processing a substratum shown in FIG. 14, the drying of the raw material solution in the step (D) is carried out with a known batch type drying apparatus (not shown) instead of employing the drying step using the third processing apparatus 80 in the constitution example of the apparatus for processing a substratum shown in FIG. 13.

As shown in the constitution example of the apparatus for processing a substratum shown in FIG. 15, the third processing apparatus of single wafer processing apparatus type can be used. And, the substrata 11 are held with a substrata holding tool, such as a substrata holder boat 86, capable of holding a plurality of substrata 11. Otherwise, the drying apparatus of single wafer processing apparatus type can be used as shown in the constitution example of the apparatus for processing a substratum shown in FIG. 16.

Figure 17:
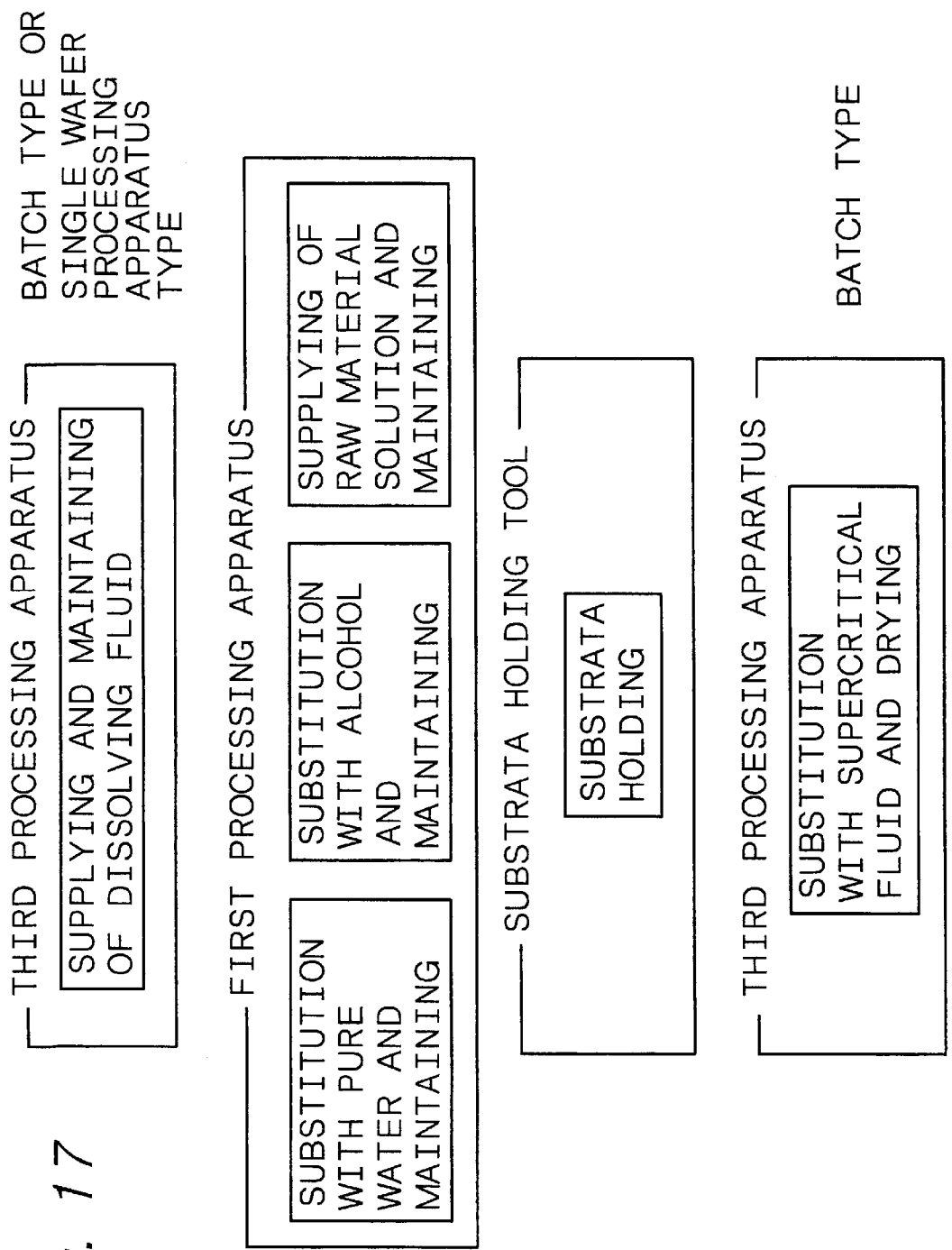
FIG. 17 is further another block diagram of a constitution example of an apparatus for processing a substratum for carrying out the method of forming a buried wiring in the present invention.
Figure 18:
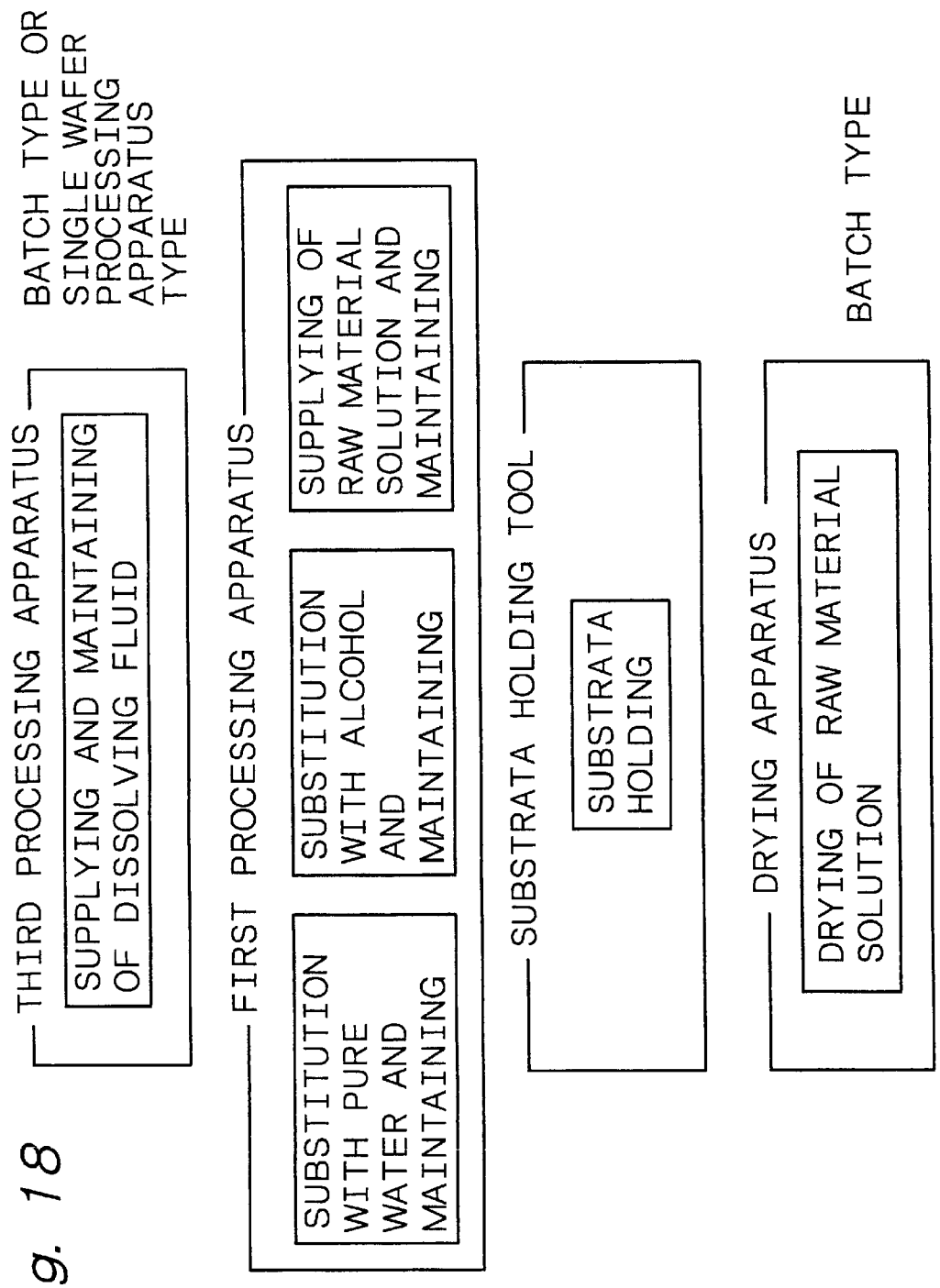
FIG. 18 is further another block diagram of a constitution example of an apparatus for processing a substratum for carrying out the method of forming a buried wiring in the present invention.

In the constitution example of the apparatus for processing a substratum shown in FIG. 17, the step (B) is carried out with the third processing apparatus 80 explained in Example 4, and the step (C) and the filling step in the step (D) are carried out with the first processing apparatus 60 or 60A explained in Example 2. Then, the substrata 11 are held with a substrata holding tool, such as a substrata holder boat 86, capable. of holding a plurality of substrata 11. Then, the drying of the raw material solution in the step (D) is carried out with the third processing apparatus 80 explained in Example 4. In the constitution example of the apparatus for processing a substratum shown in FIG. 18, the drying of the raw material solution in the step (D) is carried out with a known batch type drying apparatus (not shown) instead of employing the drying step using the third processing apparatus 80 in the constitution example of the apparatus for processing a substratum shown in FIG. 17. Alternatively, the third processing apparatus or the drying apparatus of single wafer processing apparatus type can be used.

In the constitution example of the apparatus for processing a substratum shown in FIG. 19, the step (B) is carried out with the third processing apparatus explained in Example 4, and the step (C) and the filling step in the step (D) are carried out with a plurality of the second processing apparatus 60B explained in Example 3. Then, the substrata 11 are held with a substrata holding tool, such as a substrata holder boat 86, capable of holding a plurality of substrata 11. Then, the drying of the raw material solution in the step (D) is carried out with the third processing apparatus 80 explained in Example 4. In the constitution example of the apparatus for processing a substratum shown in FIG. 20, the drying of the raw material solution in the step (D) is carried out with a known batch type drying apparatus (not shown) instead of employing the drying step using the third processing apparatus 80 in the constitution example of the apparatus for processing a substratum shown in FIG. 19. Alternatively, the third processing apparatus or the drying apparatus of single wafer processing apparatus type can be used.

The present invention is explained with reference to the preferred embodiments hereinabove, while the structures of constituting elements, forming conditions, various raw materials used and the like in the method of forming a buried wiring are shown as examples and may be changed or altered as required. For example, in Examples, a so-called single damascene process and a dual damascene process are used to form the wirings. However, some wiring can be formed by a single damascene process alone or can be formed by a dual damascene process alone. Further, the structures of the first processing apparatus, the second processing apparatus and the third processing apparatus for constituting the apparatus for processing a substratum are shown as examples, and may be changed or altered as required.

As explained above, according to the method of forming a buried wiring, provided by the present invention, there is no case where the wiring is broken due to an influence of a surface tension caused in a gas/liquid interface, and the second insulating layer can be formed of a porous insulating layer having a high porosity, which is said to have low durability against a chemical/mechanical polishing method. Therefore, a second insulating layer having a low relative dielectric constant (∈), as low as about, for example, 1.5 or lower, can be filled between the wirings (for example, wiring lines, a plug, an electrode or any combination of these). Further, the second insulating layer is formed according to substitution with a liquid or fluid and a reaction in a liquid phase, so that an insulating layer structure which is free of a failure in the filling and has high uniformity can be realized.

Further, the drying can be carried out without shrinking the porous second insulating layer having a high porosity by drying the raw material solution according to a supercritical drying method. Therefore, the damage of the wiring caused by a stress during the drying can be prevented. Further, since the temperature for the supercritical drying is as low as 300° C. or lower, there is almost no case where a wiring structure or a interfacial peeling takes place due to the thermal expansion of the wiring and the insulating layer during the drying, and there is almost no case where the breaking and the interfacial peeling of the wiring structure takes place due to a thermal expansion coefficient difference between the wiring and the insulating layer, so that a highly reliable wiring structure can be achieved.

According to the apparatus for processing a substratum of the present invention, various fluids for processing can be fed onto a substratum, and the substratum can be processed in various ways with the fluids. Further, in a state where the substratum is covered with the fluid, or in a state where the substratum is immersed in the fluid, such a fluid can be replaced with other fluid, and a fluid can be substituted without exposing the wiring to any gas.

What is claimed is:

1. A method of forming a buried wiring, said method comprising the steps of:

(A) forming a wiring and a first insulating layer filled between the wirings on a substratum, (B) immersing the first insulating layer in a fluid which can dissolve the first insulating layer, to dissolve the first insulating layer into the fluid, (C) substituting, for the fluid, a raw material solution containing a raw material for forming a second insulating layer, without bringing the wiring into contact with a gas, and (D) filling a second insulating layer formed by gelation in the raw material solution at least between the wirings, and then, drying off the raw material solution, thereby to form the second insulating layer at least between the wirings.

2. The method of forming a buried wiring according to claim 1, wherein the first insulating layer is composed of a silicon oxide material and the fluid is an aqueous solution containing fluorine.

3. The method of forming a buried wiring according to claim 1, wherein the first insulating layer is composed of an organic insulating material and the fluid is one member selected from the group consisting of an amine-containing alkaline solution, a nitric acid aqueous solution and a mixture solution of hydrofluoric acid and nitric acid.

4. The method of forming a buried wiring according to claim 1, wherein the first insulating layer is composed of an organic insulating material and the fluid is one supercritical fluid selected from the group consisting of water, carbon dioxide, methyl alcohol, ethyl alcohol and oxygen.

5. A method of forming a buried wiring, said method comprising the steps of:

(A) forming a wiring and a first insulating layer filled between the wirings on a substratum, (B) immersing the first insulating layer in a fluid which can dissolve the first insulating layer, to dissolve the first insulating layer into the fluid, (C) substituting, for the fluid, a raw material solution containing a raw material for forming a second insulating layer, without bringing the wiring into contact with a gas, and (D) filling a second insulating layer formed by gelation in the raw material solution at least between the wirings, and then, drying off the raw material solution, thereby to form the second insulating layer at least between the wirings, wherein the step (C) has the steps of:

(C-1) substituting pure water for the fluid, (C-2) substituting an alcohol solvent for the pure water, and (C-3) substituting the raw material solution for the alcohol solvent.

6. A method of forming a buried wiring, said method comprising the steps of:
   (A) forming a wiring and a first insulating layer filled between the wirings on a substratum,
   (B) immersing the first insulating layer in a fluid which can dissolve the first insulating layer, to dissolve the first insulating layer into the fluid,
   (C) substituting, for the fluid, a raw material solution containing a raw material for forming a second insulating layer, without bringing the wiring into contact with a gas, and
   (D) filling a second insulating layer formed by gelation in the raw material solution at least between the wirings, and then, drying off the raw material solution, thereby to form the second insulating layer at least between the wirings,
   wherein the raw material solution is a solution containing an organic polymer formed by hydrolyzing a silicon alkoxide and dehydration-condensing the resultant silicon hydroxide, and
   the step of drying off the raw material solution in the step (D) includes the steps of:
   (D-1) substituting a supercritical fluid for the solvent in the raw material solution, and
   (D-2) removing the supercritical fluid.

7. A method of forming a buried wiring, said method comprising the steps of:
   (A) forming a wiring and a first insulating layer filled between the wirings on a substratum,
   (B) immersing the first insulating layer in a fluid which can dissolve the first insulating layer, to dissolve the first insulating layer into the fluid,
   (C) substituting, for the fluid, a raw material solution containing a raw material for forming a second insulating layer, without bringing the wiring into contact with a gas, and
   (D) filling a second insulating layer formed by gelation in the raw material solution at least between the wirings, and then, drying off the raw material solution, thereby to form the second insulating layer at least between the wirings,
   wherein the raw material solution is a solution containing an organic polymer formed by hydrolyzing a silicon alkoxide and dehydration-condensing the resultant silicon hydroxide, and
   the step of drying off the raw material solution in the step (D) is the step of removing the solvent in the raw material solution under a pressure equal to, or lower than, atmospheric pressure.

8. A method of forming a buried wiring, said method comprising the steps of:
   (A) forming a wiring and a first insulating layer filled between the wirings on a substratum,
   (B) immersing the first insulating layer in a fluid which can dissolve the first insulating layer, to dissolve the first insulating layer into the fluid,
   (C) substituting, for the fluid, a raw material solution containing a raw material for forming a second insulating layer, without bringing the wiring into contact with a gas, and
   (D) filling a second insulating layer formed by gelation in the raw material solution at least between the wirings, and then, drying off the raw material solution, thereby to form the second insulating layer at least between the wirings,
   wherein the raw material solution is solution containing an organic polymer containing carbon and fluorine or a condensate thereof, and
   the step of drying off the raw material solution in the step (D) includes the steps of:
   (D-1) substituting a supercritical fluid for the solvent in the raw material solution, and
   (D-2) removing the supercritical fluid.

9. A method of forming a buried wiring, said method comprising the steps of:
   (A) forming a wiring and a first insulating layer filled between the wirings on a substratum,
   (B) immersing the first insulating layer in a fluid which can dissolve the first insulating layer, to dissolve the first insulating layer into the fluid,
   (C) substituting, for the fluid, a raw material solution containing a raw material for forming a second insulating layer, without bringing the wiring into contact with a gas, and
   (D) filling a second insulating layer formed by gelation in the raw material solution at least between the wirings, and then, drying off the raw material solution, thereby to form the second insulating layer at least between the wirings,
   wherein the raw material solution is solution containing an organic polymer containing carbon and fluorine or a condensate thereof, and
   the step of drying off the raw material solution in the step (D) is the step of removing the solvent in the raw material solution under a pressure equal to, or lower than, atmospheric pressure.

10. A method of forming a buried wiring, said method comprising the steps of:
    (A) forming a wiring and a first insulating layer filled between the wirings on a substratum,
    (B) immersing the first insulating layer in a fluid which can dissolve the first insulating layer, to dissolve the first insulating layer into the fluid,
    (C) substituting, for the fluid, a raw material solution containing a raw material for forming a second insulating layer, without bringing the wiring into contact with a gas, and
    (D) filling a second insulating layer formed by gelation in the raw material solution at least between the wirings, and then, drying off the raw material solution, thereby to form the second insulating layer at least between the wirings,
    wherein said method further includes the step of forming a protective insulating layer on the substratum for protecting the substratum from the fluid which dissolves the first insulating layer, prior to the step (A).

* * * * *